(12) United States Patent
Chishiki

(10) Patent No.: US 6,479,853 B2
(45) Date of Patent: *Nov. 12, 2002

(54) SEMICONDUCTOR DEVICE AND MANUFACTURING METHOD THEREOF

(75) Inventor: Shigeo Chishiki, Kumamoto (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/157,536

(22) Filed: Sep. 21, 1998

(65) Prior Publication Data

US 2002/0125522 A1 Sep. 12, 2002

(30) Foreign Application Priority Data

Sep. 22, 1997 (JP) ............................... 9-256995

(51) Int. Cl.⁷ ....................... H01L 27/108; H01L 29/76; H01L 29/94; H01L 31/119
(52) U.S. Cl. ....................... 257/306; 257/303
(58) Field of Search ................ 257/296–310; 438/241–253, 346–399, 423

(56) References Cited

U.S. PATENT DOCUMENTS

| | | | | |
|---|---|---|---|---|
| 5,223,448 A | * | 6/1993 | Su ........................ | 438/396 |
| 5,346,844 A | * | 9/1994 | Cho et al. ............... | 438/253 |
| 5,688,713 A | * | 11/1997 | Linliu et al. ............. | 438/396 |
| 5,691,229 A | * | 11/1997 | Okamura et al. ......... | 438/253 |
| 5,786,249 A | * | 7/1998 | Dennison ................. | 438/241 |
| 5,825,059 A | * | 10/1998 | Kuroda ................... | 257/301 |
| 5,866,453 A | * | 2/1999 | Prall et al. ............... | 438/253 |
| 5,913,131 A | * | 6/1999 | Hossain et al. .......... | 438/423 |
| 5,926,715 A | * | 7/1999 | Fan et al. ................ | 438/305 |

FOREIGN PATENT DOCUMENTS

| | | | |
|---|---|---|---|
| JP | 5-206303 | | 8/1993 |
| JP | 5-275367 | | 10/1993 |
| JP | 6-5543 | | 1/1994 |
| JP | 6-177265 | | 6/1994 |
| JP | 6-196433 | | 7/1994 |
| JP | 6-196498 | | 7/1994 |
| JP | 6-224310 | | 8/1994 |
| JP | 407050348 A | * | 2/1995 |
| JP | 407122742 A | * | 5/1995 |
| JP | 10-70086 | | 3/1998 |

* cited by examiner

*Primary Examiner*—Tom Thomas
*Assistant Examiner*—Cuong Q Nguyen
(74) *Attorney, Agent, or Firm*—Sughrue Mion, PLLC

(57) ABSTRACT

A semiconductor device and a semiconductor device manufacturing method provide a self align contact hole which is easy to restrain deterioration of insulation characteristics between an upper wiring layer connecting to a lower wiring layer via a self matching self align contact hole for a middle wiring layer and a middle wiring layer. The side of a bit contact hole which is self matching for a gate electrode is directly covered with a silicon oxide film spacer and a silicon oxide film spacer is reflowed and covered with a BPSG film spacer. With these processes, the restraint of the deterioration of insulation characteristics is implemented.

5 Claims, 29 Drawing Sheets

306  304  305  303  306

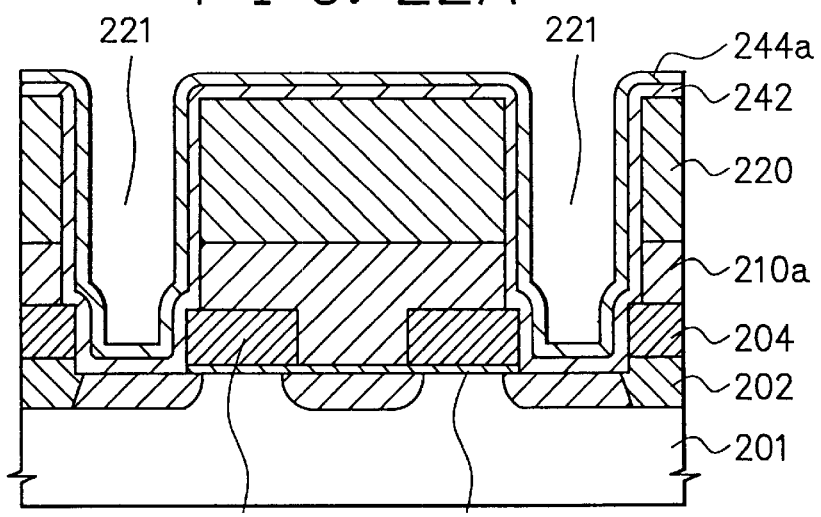
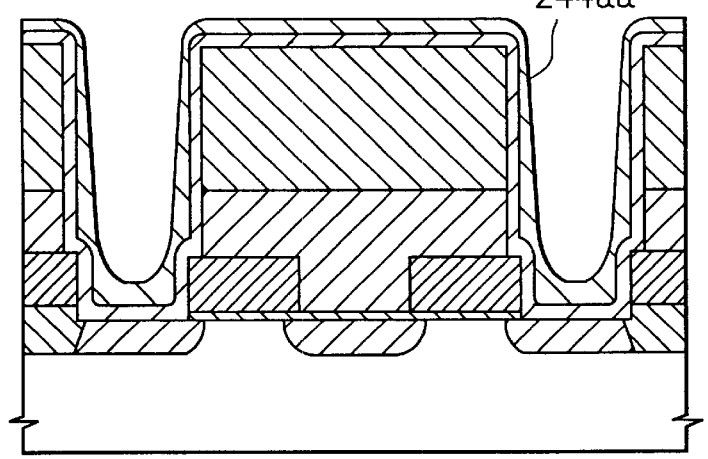
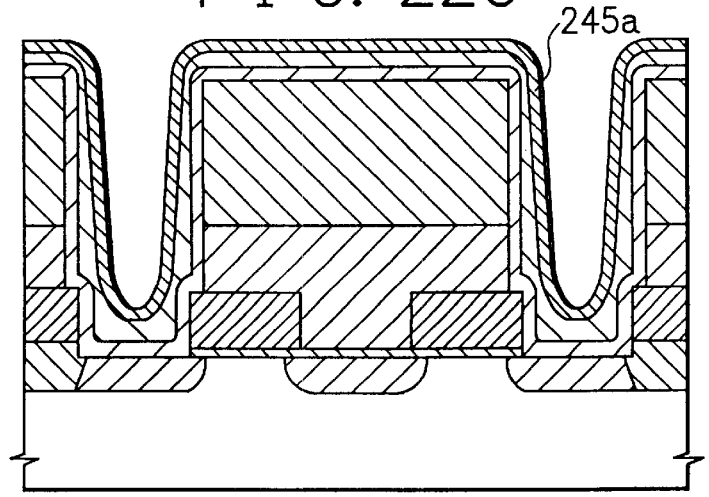

SEMICONDUCTOR DEVICE AND MANUFACTURING METHOD THEREOF

BACKGROUND OF THE INVENTION

The present invention relates to a semiconductor device and a manufacturing method thereof, in particular, comprising a self align contact hole.

DESCRIPTION OF THE RELATED ART

The integration degree of a semiconductor device is mainly improved by the progress of the fine processing technology and also depends on the advancement of the multilayer wiring technology. From a viewpoint of the improvement of the integration degree, one of the important technical issues in the multilayer wiring technology is how to connect an upper wiring layer directly to a lower wiring layer avoiding a connection via a middle wiring layer. As a typical example of a solution of such a technical issue, a self align contact hole is now being watched. The self align contact hole reaching from the upper wiring layer to the lower wiring layer is provided at the middle wiring layer as a self matching i.e. at a vacant part of the middle wiring layer, at a lower part than an upper surface of the middle wiring layer. At a part of the self align contact hole, an insulation separation between the third wiring layer (and the first wiring layer) and the second wiring layer is implemented by an insulation film spacer provided at a side of the self align contact hole.

The self align contact hole is adopted in a normal multilayer wiring and is also becoming larger usage in DRAM corresponding to the reduction of the size of memory cell. In particular, at the COB (Capacitor Over Bit-line) structure DRAM provided a storage node electrode at the upper layer of the bit-line, a tendency to use a self align contact hole for a bit contact hole and a node contact hole is getting larger, wherein a bit contact hole is a hole to connect a bit line to one side of a source drain area and a node contact hole is a hole to connect a storage node electrode that is a lower electrode of capacitor to the other side of a source drain area. In this case, the bit contact hole is self matching to a gate electrode which also serves as a word line, the node contact hole is self matching to both a gate electrode and a bit line. Next, the conventional self align contact hole is explained, with an example which the bit contact hole and the node contact hole of the COB structure DRAM are made of the self align contact holes.

Referring to FIG. 1 showing a plan view of DRAM, FIGS. 2A and 2B showing section views of DRAM and section views of both I—I line and, II—II line of FIG. 1 and FIGS. 3A and 3B showing section views of DRAM and section views of both III—III line and IV—IV line of FIG. 1, the constitution of the COB structure DRAM in which the bit contact hole and the node contact hole are made of self align contact hole are explained in a below description. An elements forming area is shown in hatching in FIG. 1, however, the drawing of a capacity insulation film constituting a capacitor and a cell plate electrode are omitted in FIGS. 1, 2A, 2B, 3A and 3B.

On a surface of a P type silicon substrate 301, T formed element forming areas are disposed regularly, a gate oxide film 303 with about 10 nm thickness is provided on the surface of 301. On a surface of element separation areas surrounding these element forming areas of the P type silicon substrate 301, a field oxide film 302 with for example LOCOS type about 300 nm thickness is provided. On the surface of the field oxide film 302 and the gate oxide film 303, a gate electrode 304 also served as a word line is provided in a certain direction in parallel. A line width and an interval of these gate electrodes 304 are for example about 0.4 µm respectively, these gate electrodes 304 are constituted of a tungsten polycide film laminated an about 150 nm thickness tungsten silicide film to an about 100 nm thickness N type polycrystal silicon film (not shown in Figs.). On the surface of the P type silicon substrate 301 of the respective element forming areas, the gate electrode 304, one of N type source drain area 305 self matching to the field oxide film 302 and two N type source drain areas 306 are provided. The minimum line width and the minimum interval of the N type source drain area 305 and 306 are respectively about 0.4 µm.

The surface of the P type silicon substrate 301 including the gate electrode 304, the field oxide film 302 and the gate oxide film 303 is covered with an insulation film between layers 310a made of a silicon oxide type insulation film. The surface of the insulation film between layers 310a is flattened and the film thickness of the insulation film between layers 310a from the surface of the P type silicon substrate 301 is about 500 nm. The upper surface of the insulation film between layers 310a and the bottom face of the insulation film between layers 310a covering directly the gate electrode 304 are constituted of at least a silicon oxide film.

At the insulation film between layers 310a, a bit contact hole 311 reaching the N type source drain area 305 penetrating the insulation film between layers 310a and the gate oxide film 303 from the surface of this insulation film between layers 310a is provided. The bit contact hole 311 is formed in self matching for the gate electrode 304 and penetrates the insulation film between layers 310a of the vacant part of the gate electrode 304. At the upper surface of the insulation film between layers 310a, an upper end bore of the bit contact hole 311 is about 0.5 µm but the minimum bore of the bit contact hole 311 being at the lower part than the upper face of the gate electrode 304 is the same as an interval of the gate electrode 304 and is about 0.4 µm, this minimum bore is a bore of an orthogonal direction of the gate electrode 304. The upper face and a part of a side face of the gate electrode 304 are exposed by the bit contact hole 311. The side face of the bit contact hole 311 is covered directly with a silicon oxide film spacer 312 of about 100 nm thickness except a part of the side face of the exposed gate electrode 304.

On the surface of the insulation film between layers 310a, a bit line 317 connecting to the N type source drain area 305 via the bit contact hole 311 is provided in parallel in an orthogonal direction of the gate electrode 304. The bit line 317 is the same as the gate electrode 304, is constituted of the tungsten polycide film laminated a tungsten silicide film 337 with about 150 nm thickness to an N type polycrystal silicon film 336 with about 100 nm thickness. A wiring pitch of the bit line 317 is about 0.8 µm, a line width and an interval of the bit line 317 at the part of the bit contact hole 311 are about 0.5 µm and 0.3 µm, the line width and the interval of the bit line 317 except the part of the bit contact hole 311 is about 0.4 µm. The surface of the insulation film between layers including these bit line 317 is covered with an insulation film between layers 320a constituting of a silicon oxide type insulation film. An upper face of the insulation film between layers 320a is also flattened and a thickness of the insulation film between layers 320a from the surface of the insulation film between layers 310a is about 350 nm. The upper face of the insulation film between layers 320a and the bottom face of the insulation film between layers 320a covering directly the bit line 317 are at least formed by the silicon oxide film (FIGS. 1, 2A and 2B).

In the insulation film between layers 320a, a node contact hole 321 reaching an N type source drain area 306 penetrating these insulation film between layers 320a, 310a and the gate oxide film 303 from this surface is provided. A node contact hole 321 is formed in self matching for the bit line 317 and penetrates the insulation film between layers 320a of the vacant part of the bit line 317, further is formed in self matching for the gate electrode 304 and penetrates the insulation film between layers 310a of the vacant part of the gate electrode 304. At the upper face of the insulation film between layers 320a, a bore of the node contact hole 321 is about 0.5 μm and the minimum bore of the node contact hole 321 from the upper face of the bit line 317 to the upper face of the gate electrode 304 is about 0.4 μm, a bore of the node contact hole 321 at the lower part than the upper face of the gate electrode 304 is about 0.4 μm. By these node contact holes 321, the upper face and a part of the side of the bit line 317 and the upper face and a part of the side of the gate electrode 304 are exposed. A side of the node contact hole 321 except the exposed bit line 317 and a part of the side of the gate electrode 304 is covered directly with the silicon oxide film spacer 322 with about 100 nm thickness.

On the surface of the insulation film between layers 320a, a storage node electrode 327 connecting to the N type source drain area 306 via the node contact hole 321 is provided. The storage node electrode 327 is constituted of an N type polycrystal silicon film with about 700 nm thickness. A long length direction of the storage node electrode 327 is parallel with the bit line 317 and a length, a width and an interval of the storage node electrode 327 are about 1.3 μm, 0.5 μm and 0.3 μm respectively, pitches of the storage node electrode 327 in a parallel direction of the bit line 317 and the gate electrode 304 are about 1.6 μm and 0.8 μm respectively (FIGS. 1, 3A and 3B).

Referring to FIGS. 1, 2A, 2B, 3A and 3B and FIGS. 4A, 4B and 4C showing section views of III—III line of FIG. 1 and FIGS. 5A, 5B and 5C showing section views of IV—IV line of FIG. 1, an outline of a manufacturing method of DRAM is stated below. The minimum processing dimension is about 0.3 μm, an alignment margin in the photo lithography is about 0.05 μm.

First, in an element separation area on a surface of the P type silicon substrate 301, for example a field oxide film 302 with about 300 nm thickness is formed by selective oxidation and in an element forming area on a surface of the P type silicon substrate 301, a gate oxide film 303 with about 10 nm thickness is formed by heat oxidation. On the whole surface, an N type polycrystal silicon film with about 100 nm thickness and a tungsten silicide film with about 150 nm thickness are formed in order, these tungsten silicide film and N type polycrystal silicon film are patterned by an anisotropic etching in order and a gate electrode 304 is formed. By an ion injection of arsenic As etc., using as a mask the gate electrode 304 and the field oxide film 302, in an element forming area of the surface of the P type silicon substrate 301 a source drain area 305 and 306 are formed. For example, a HTO film by the high temperature vapor phase grown method and a BPSG film used TEOS as a main gas material are formed on the whole surface, the BPSG film is reflowed by about 800° C. heat treatment, further, after a surface of the BPSG film flattened by a chemical mechanical polishing, a silicon oxide film with about 100 nm thickness is formed on the whole surface and a first insulation film between layers with about 520 nm thickness which corresponds to a height from the surface of the P type silicon substrate 301 is formed.

Next, by a high selectivity anisotropic etching for the polycrystal silicon film and tungsten suicide film and so on using a photo resist pattern to the mask, the first insulation film between layers and the gate oxide film 303 are etched and a bit contact hole 311 reaching from the upper surface of the first insulation film between layers to the N type source drain area 305 is formed. At this time, a slit width of the upper surface of the gate electrode 304 disposed by the bit contact hole 311 is about 50 nm disregarding the alignment margin. By LPCVD, a silicon oxide film with about 100 nm thickness is formed on the whole surface. This silicon oxide film is etch backed by the anisotropic etching, a silicon oxide film spacer 312 covered the side of the bit contact hole 311 is formed. Together with this, the first insulation film between layers is also etch backed and becomes the insulation film between layers 310a with about 500 nm thickness. At the bottom face of the bit contact hole 311, the minimum width of the N type source drain area 305 exposed and not covered by the silicon oxide film spacer 312 is about 200 nm. At the near part to the upper surface of the side of the gate electrode 304 exposed by the bit contact hole 311, disregarding the alignment margin, the thickness of the silicon oxide film spacer 312 is about 50 nm at that part (FIGS. 1, 2A and 2B).

In the next process, an N type polycrystal silicon film 336 with about 100 nm thickness and a tungsten silicide film 337 with about 150 nm thickness are formed on the whole surface. By the anisotropic etching, a tungsten silicide film 337 and an N type polycrystal silicon film 336 are formed in order, a bit line 317 connecting to the N type source drain area 305 via the bit contact hole 311 is formed. To avoid occurrence of issues of the insulation separation between the bit line 317 and the gate electrode 304 and parasitic capacity between them, a thickness of the silicon oxide film spacer 312 is about 30 nm enough, even in case of the silicon oxide film spacer is constituted of the vapor phase grown film (FIGS. 1, 2A and 2B).

Then, by the same method forming the first insulation film between layers, an insulation film between layers 320 with about 370 nm thickness is formed (FIGS. 4A and 5A). By the same method forming the bit contact hole 311, an insulation film between layers 320, 310a and the gate oxide film 303 are etched by the anisotropic etching, a node contact hole 321 reaching the N type source drain area 306 from an upper surface of the insulation film between layers 320 is formed. At this time, the slit widths of the upper surface of the gate electrode 304 and the bit line 317 exposed by the node contact hole 321 are about 50 nm respectively, disregarding the alignment margin. By LPCVD, a silicon oxide film 342 with about 100 nm thickness on the whole surface is formed (FIGS. 4B and 5B).

The silicon oxide film 342 is etch backed by the anisotropic etching, a silicon oxide film spacer 322 covering the side of the node contact hole 321 is formed. With this, the insulation film between layers 320 is also etch backed and becomes an insulation film between layers 320a with about 500 nm thickness. At the near part to the upper surface of the side of the gate electrode 304 and the bit line 317 exposed by the node contact hole 321, disregarding the alignment margin, the width of the silicon oxide film spacer 312 is about 50 nm at that part (FIGS. 1, 4C and 5C).

After this, by LPCVD, a silicon film made of an N type amorphous or polycrystal at the process of film forming is formed. The thickness of this silicon film is about 700 nm. This silicon film is patterned by the anisotropic etching and a storage node electrode 327 being finally an N type polycrystal silicon film implemented heat treatment if needed is formed (FIGS. 1, 2A, 2B, 3A and 3B).

As shown in FIGS. 1 to 5C, on condition that the bit contact hole and the node contact hole of DRAM are the self align contact holes, step parts formed by the exposure of the wiring layer of middle layer at the side of the respective contact holes are formed, of necessity. At the bit contact hole, one part of the N type source drain areas becomes a lower wiring layer, the gate electrode becomes a middle wiring layer and the bit line becomes an upper wiring layer. At the node contact hole, the other part of the N type source drain areas becomes a lower wiring layer, the bit line and the gate electrode become middle wiring layers and the storage node electrode becomes an upper wiring layer.

A surface shape of the silicon oxide film formed on the whole surface having a shape covering the side and bottom surfaces of the self align contact hole is somewhat lessened the shape of step parts at the middle wiring layer but reflects the shape of these step parts. A silicon oxide film spacer covering the side of the self align contact hole is formed by the etch back of the silicon oxide film having the surface somewhat lessened the shape of the step parts, therefore at least at the near part to the upper surface of the side of the step part of the middle wiring layer exposed by the self align contact hole, thinning of the thickness of the silicon oxide film spacer partly can not be avoided. The thickness of the silicon oxide film spacer at the partly thinned part is decided by the upper end bore of the self align contact hole, the interval of the middle wiring layer and the thickness of the silicon oxide film spacer formed on the whole surface becoming this silicon oxide film spacer and the alignment margin at the photo lithography, and not decided only by the above mentioned thickness of the silicon oxide film. A small change of the thickness of the silicon oxide film spacer in the above mentioned part largely depends on this alignment margin. Therefore, the decreasing of the insulation characteristics including leak and short between the upper wiring layer/lower wiring layer connecting to the upper wiring layer and the middle wiring layer is liable to occur.

For example, as mentioned in the Japanese Patent Laid-Open Ser. No. 6-177265, by covering the upper surface of the gate electrode with a silicon nitride film cap, forming a silicon oxide film spacer at the side of the gate electrode, furthermore forming a silicon nitride film spacer which covers the silicon oxide film spacer and then forming a self align contact hole for the gate electrode, only the point lessening the lowering of the insulation characteristics is solved. However, the part between the upper wiring layer/the diffusion layer being the lower wiring layer and the gate electrode becomes a NMOS type nonvolatile memory at the constitution of said Japanese Patent, an electric charge is stored in the silicon nitride film spacer and a new electric characteristics issue occurs. In case of the constitution of said Japanese Patent, the silicon nitride film cap and the silicon nitride film spacer must be formed in the whole wiring layers being the middle wiring layers. Therefore, a complicated manufacturing process for forming the middle wiring layer is required in this kind of the constitution of the semiconductor device.

SUMMARY OF THE INVENTION

It is therefore an object of the present invention to resolve all the problems mentioned, and to provide a semiconductor device capable of restraining the deterioration of the insulation characteristics between the upper wiring layer/the lower wiring layer connecting to this upper wiring layer and the middle wiring layer via the self align contact hole, without storing an electric charge in the insulation film spacer formed at the side of the self align contact hole. Moreover, it is another object of the present invention to provide a manufacturing method of said semiconductor device and provide a manufacturing method which does not require a complicated manufacturing process forming the middle wiring layer.

The present invention, there is provided a lower wiring layer formed at or on a surface of a semiconductor substrate, an insulation film covering the surface of this semiconductor substrate, a middle wiring layer formed on the surface of this insulation film, an insulation film between layers covering these middle wiring layers and an upper wiring layer formed on the surface of the insulation film between layers. Said upper wiring layer reaches to said lower wiring layer penetrating said insulation film between layers and said insulation film and connects to this lower wiring layer via a self align contact hole in self matching for said middle wiring layer. On the side of said self align contact hole, an insulation film spacer made of a BPSG film or a PSG film reflowed by heat is at least formed.

According to a first aspect of the present invention, there is provided a lower wiring layer formed at or on a surface of a semiconductor substrate, an insulation film covering the surface of this semiconductor substrate, a middle wiring layer formed on the surface of this insulation film, an insulation film between layers covering these middle wiring layers and an upper wiring layer formed on the surface of the insulation film between layers. Said upper wiring layer reaches to said lower wiring layer penetrating said insulation film between layers and said insulation film and connects to this lower wiring layer via a self align contact hole self matching for said middle wiring layer. The side of said self align contact hole is directly covered with a first insulation film spacer made of a silicon oxide film, moreover this first insulation film spacer is covered with a second insulation film spacer made of a BPSG film or a PSG film reflowed by heat. It is desirable that a polycrystal silicon film spacer covering said second insulation film spacer is provided and an upper end of said polycrystal silicon film spacer is positioned at lower place than an upper end of said self align contact hole.

According to a second aspect of the present invention, there is provided a lower wiring layer formed at or on a surface of a semiconductor substrate, an insulation film covering the surface of this semiconductor substrate, a middle wiring layer formed on the surface of this insulation film, an insulation film between layers covering these middle wiring layers and an upper wiring layer formed on the surface of the insulation film between layers. Said upper wiring layer reaches to said lower wiring layer penetrating said insulation film between layers and said insulation film and connects to this lower wiring layer via a self align contact hole in self matching for said middle wiring layer. On the surface of said middle and lower wiring layer exposed to said self align contact hole, a silicon oxide film by heat oxidation is formed selectively, on the side of said self align contact hole, an insulation film spacer made of a BPSG film or a PSG film reflowed by heat is formed and said insulation film spacer covers the surfaces of said middle and lower wiring layers exposed to said self align contact hole via said silicon oxide film. Moreover this silicon oxide film formed on the surface of said lower wiring layer is opened to the insulation film spacer in self matching. It is desirable that a polycrystal silicon film spacer covering said insulation film spacer is provided and an upper end of said polycrystal silicon film spacer is positioned at lower place than an upper end of said self align contact hole.

According to a third aspect of the present invention, there is provided a process forming a lower wiring layer at or on a surface of a semiconductor substrate, a process forming an insulation film covering the surface of said semiconductor substrate, a process forming a middle wiring layer on the surface of said insulation film and an insulation film between layers covering said middle wiring layer, a process forming a self align contact hole in self matching for said middle wiring layer which reaches to said lower wiring layer penetrating said insulation film between layers and said insulation film, a process forming in order a silicon oxide film and a BPSG film or a PSG film on the whole surface by LPCVD and reflowing said BPSG film or said PSG film by heat, a process forming a first insulation film spacer made of a silicon oxide film by an etch back said BPSG film or said PSG film and said silicon oxide film in order with an anisotropic etching and forming a second insulation film spacer made of the BPSG film or PSG film and a process forming an upper wiring layer connecting to said lower wiring layer via said self align contact hole on the surface of the insulation film between layers.

According to a fourth aspect of the present invention, there is provided a process forming a lower wiring layer at or on a surface of a semiconductor substrate, a process forming an insulation film covering the surface of said semiconductor substrate, a process forming a middle wiring layer on the surface of said insulation film and an insulation film between layers covering said middle wiring layer, a process forming a self align contact hole in self matching for said middle wiring layer which reaches to said lower wiring layer penetrating said insulation film between layers and said insulation film, a process forming a silicon oxide film and a BPSG film or a PSG film on the whole surface in order by LPCVD and reflowing said BPSG film or said PSG film by heat, a process forming a polycrystal silicon film spacer which upper end is positioned at a lower place than the upper end of said self align contact hole by forming a polycrystal silicon film on the whole surface by LPCVD and by an etch back said polycrystal film with a selective anisotropic etching for a silicon film, a process forming a second insulation film spacer made of the BPSG film or the PSG film and forming a first insulation film spacer made of the silicon oxide film by an etch back said BPSG film or said PSG film and said silicon oxide film in order by an anisotropic etching used said polycrystal silicon film spacer as a mask and a process forming an upper wiring layer connecting to said lower wiring layer via said self align contact hole on the surface of said insulation film between layers.

According to a fifth aspect of the present invention, there is provided a process forming a lower wiring layer at or on a surface of a semiconductor substrate, a process forming an insulation film covering the surface of said semiconductor substrate, a process forming a middle wiring layer on the surface of said insulation film and an insulation film between layers covering said middle wiring layer, a process forming a self align contact hole in self matching for said middle wiring layer which reaches to said lower wiring layer penetrating said insulation film between layers and said insulation film, a process transforming a silicon film to a silicon oxide film by high speed heat treatment in an oxygen ambience by selectively growing a silicon film of required thickness on the surface of said middle and lower wiring layers exposed by said self align contact hole, a process forming a BPSG film or a PSG film on the whole surface by LPCVD and reflowing said BPSG film or said PSG film by heat, a process forming an insulation film spacer made of the BPSG film or the PSG film by an etch back the BPSG film or PSG film by an anisotropic etching and a process forming an upper wiring layer connecting to said lower wiring layer via said self align contact hole on the surface of said insulation film between layers.

According to a sixth aspect of the present invention, there is provided a process forming a lower wiring layer at or on a surface of a semiconductor substrate, a process forming an insulation film covering the surface of said semiconductor substrate, a process forming a middle wiring layer on the surface of said insulation film and an insulation film between layers covering said middle wiring layer, a process forming a self align contact hole in self matching for said middle wiring layer which reaches to said lower wiring layer penetrating said insulation film between layers and said insulation film, a process transforming a silicon film to a silicon oxide film by high speed heat treatment in an oxygen ambience by selectively growing a silicon film of required thickness on the surface of said middle and lower wiring layers exposed by said self align contact hole, a process forming a BPSG film or a PSG film on the whole surface by LPCVD and reflowing said BPSG film or said PSG film by heat, a process forming a polycrystal silicon film on the whole surface by LPCVD and forming a polycrystal silicon film spacer which upper end is positioned at the lower place than an upper end of said self align contact hole by an etch back said polycrystal silicon film by a selective anisotropic etching for the silicon film, a process forming an insulation film spacer made of said BPSG film or said PSG film by an etch back the said BPSG film or said PSG film by an anisotropic etching using said polycrystal silicon film spacer as a mask and a process forming an upper wiring layer connecting to said lower wiring layer via said self align contact hole on the surface of said insulation film between layers.

BRIEF DESCRIPTION OF THE DRAWINGS

The objects and features of the present invention will become more apparent from the consideration of the following detailed description taken in conjunction with the accompanying drawings in which:

FIG. 22A is a section view showing a manufacturing process of the first example of the second embodiment of the present invention at the III—III line of FIG. 19;

FIG. 22B is a section view showing a manufacturing process of the first example of the second embodiment of the present invention at the III—III line of FIG. 19;

FIG. 22C is a section view showing a manufacturing process of the first example of the second embodiment of the present invention at the III—III line of FIG. 19;

DESCRIPTION OF THE PREFERRED EMBODIMENTS

Figure 1:
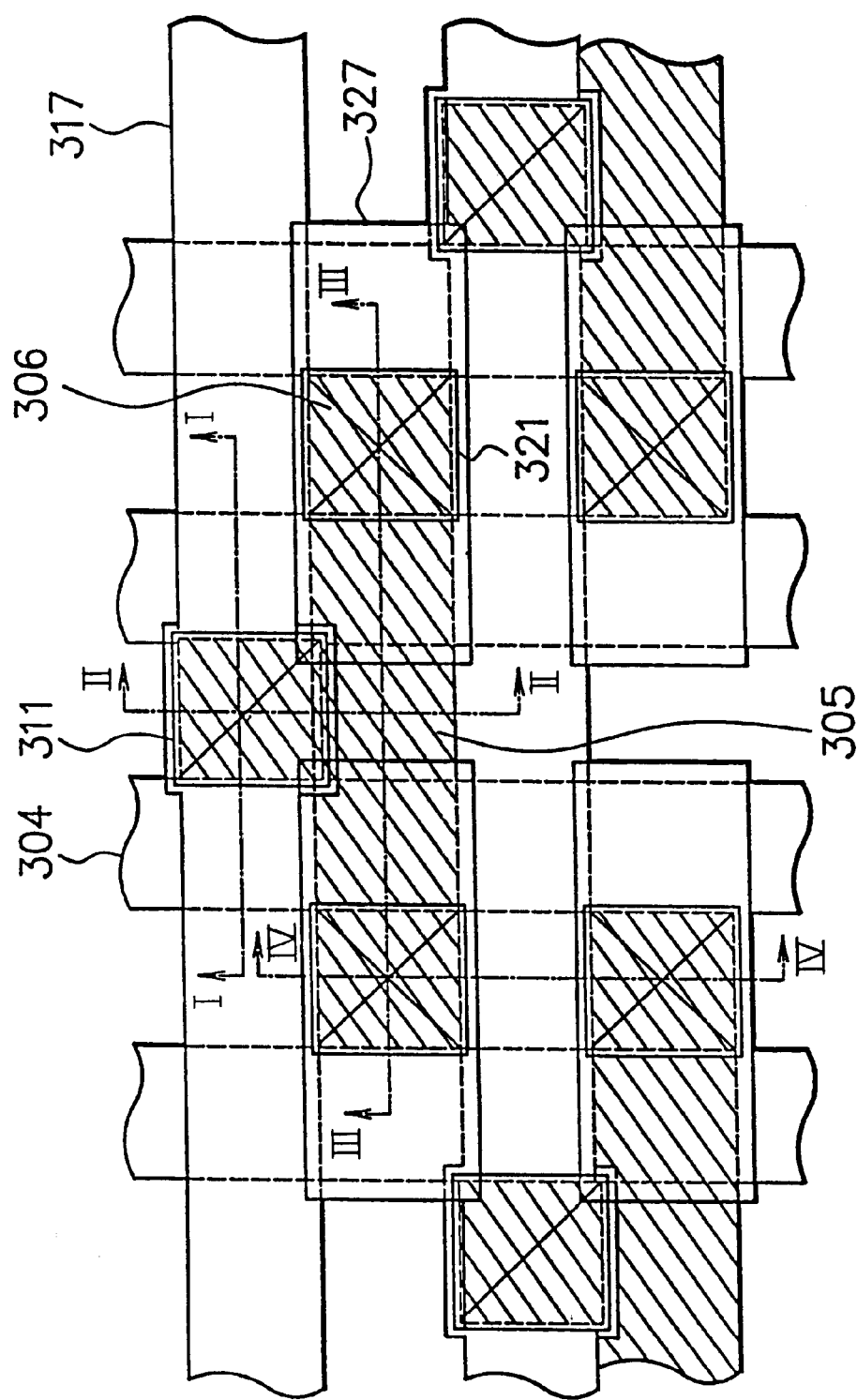
FIG. 1 is a plan view of the conventional semiconductor device having a self align contact hole.
Figure 2A:
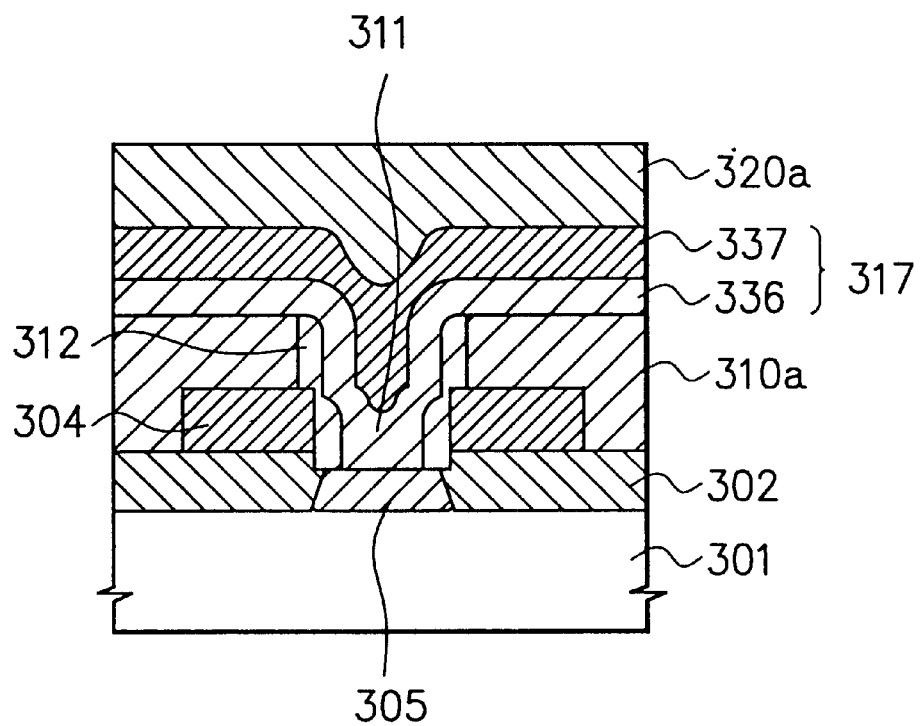
FIG. 2A is a section view of the conventional semiconductor device at the I—I line of FIG. 1.
Figure 2B:
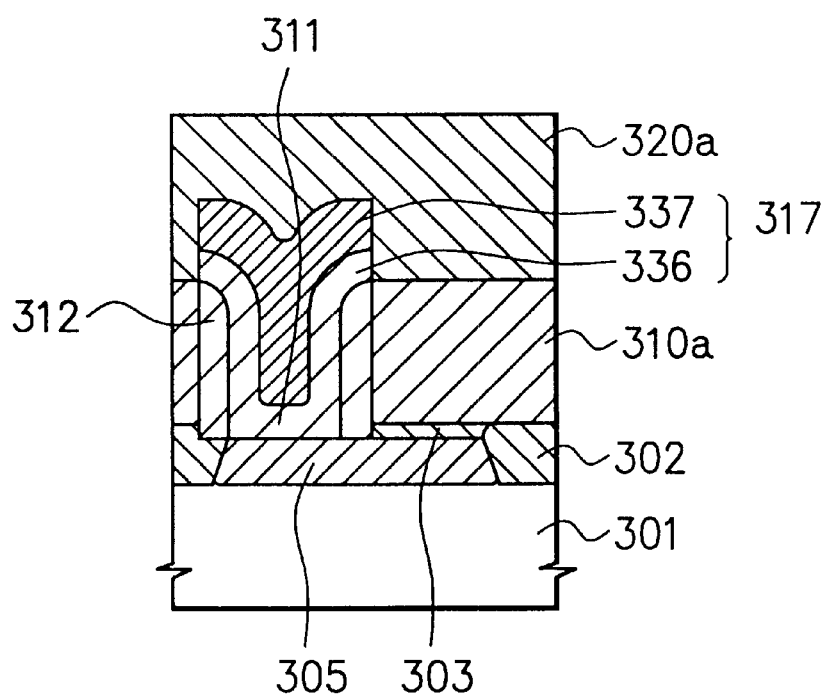
FIG. 2B is a section view of the conventional semiconductor device at the II—II line of FIG. 1.
Figure 3A:
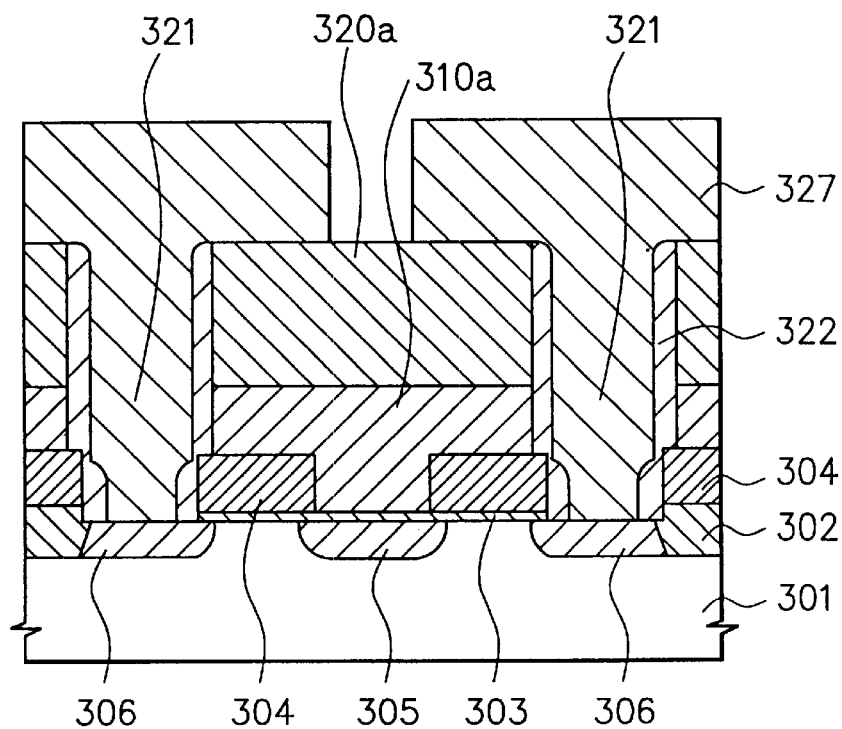
FIG. 3A is a section view of the conventional semiconductor device at the III—III line of FIG. 1.
Figure 3B:
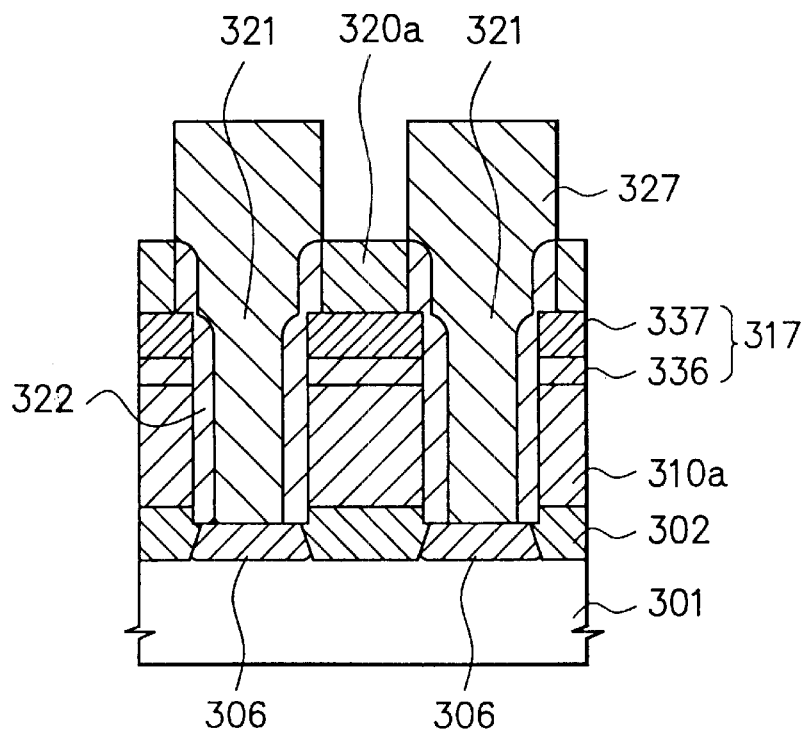
FIG. 3B is a section view of the conventional semiconductor device at the IV—IV line of FIG. 1.
Figure 4A:
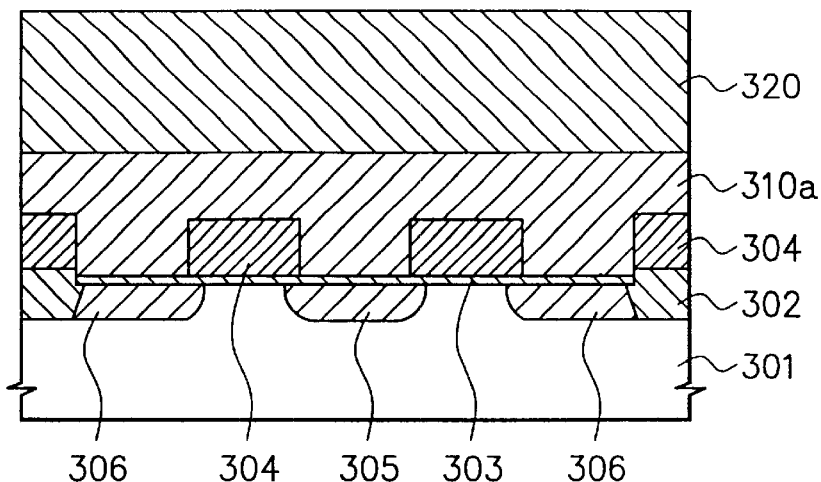
FIG. 4A is a section view showing a manufacturing process of the conventional semiconductor device at the III—III line of FIG. 1.
Figure 4B:
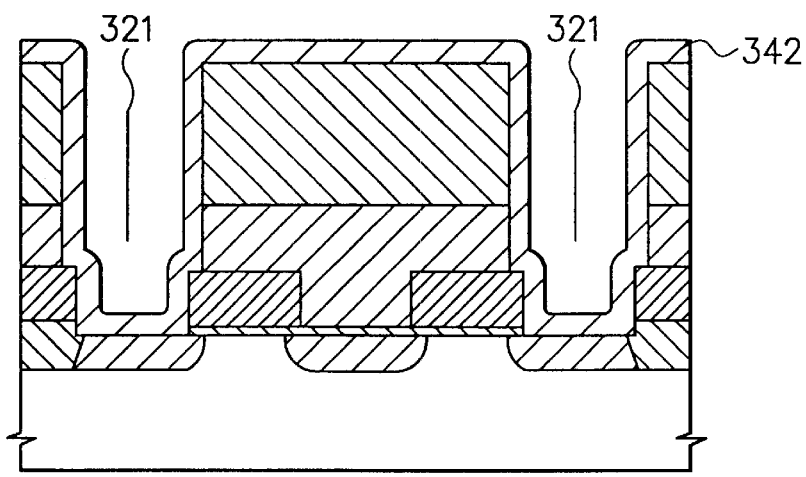
FIG. 4B is a section view showing a manufacturing process of the conventional semiconductor device at the III—III line of FIG. 1.
Figure 4C:
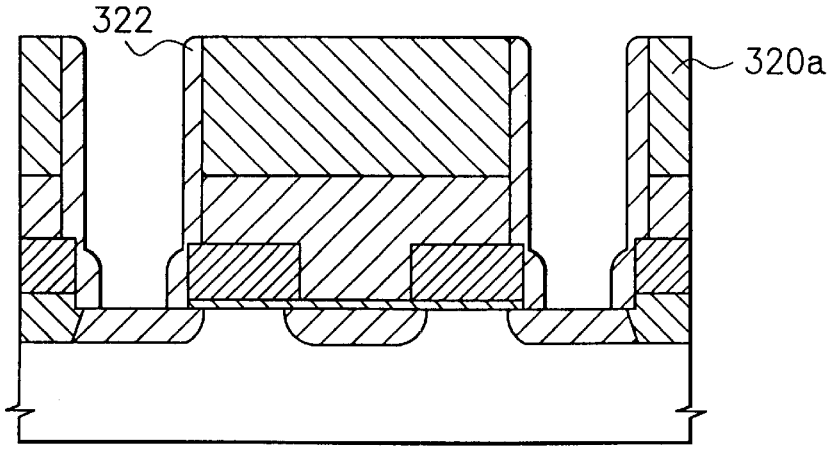
FIG. 4C is a section view showing a manufacturing process of the conventional semiconductor device at the III—III line of FIG. 1.
Figure 5A:
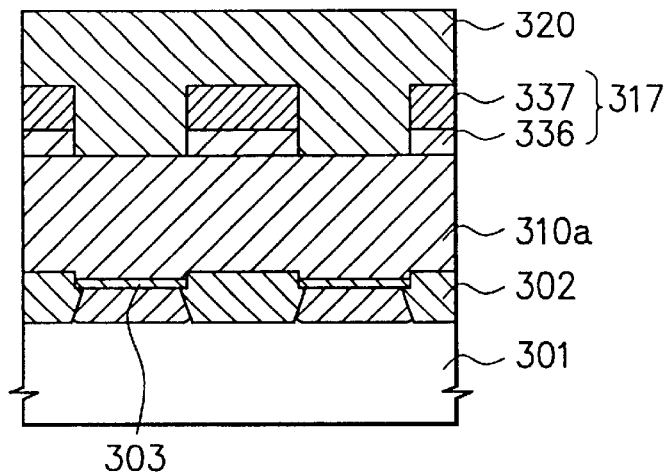
FIG. 5A is a section view showing a manufacturing process of the conventional semiconductor device at the IV—IV line of FIG. 1.
Figure 5B:
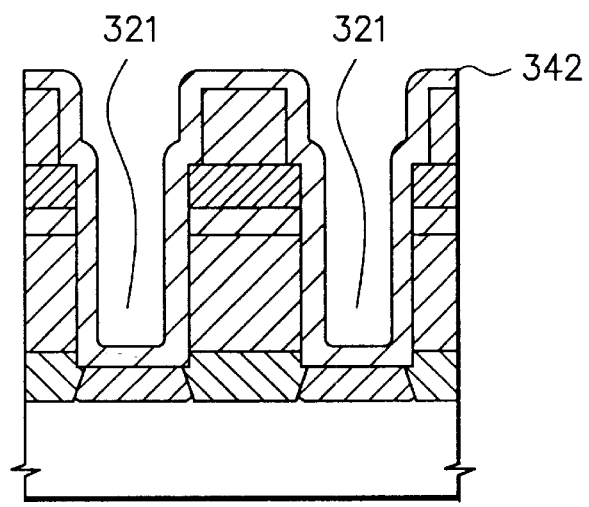
FIG. 5B is a section view showing a manufacturing process of the conventional semiconductor device at the IV—IV line of FIG. 1.
Figure 5C:
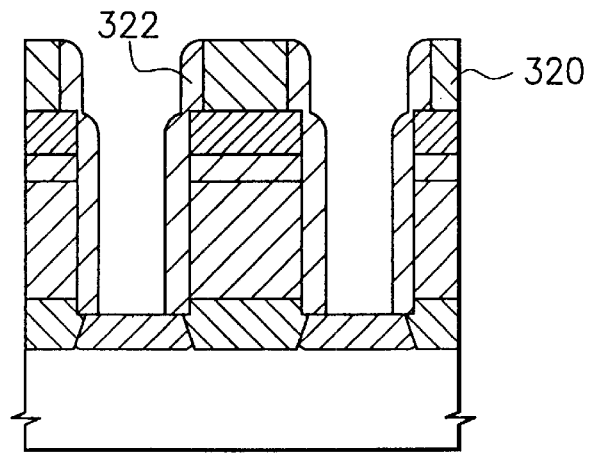
FIG. 5C is a section view showing a manufacturing process of the conventional semiconductor device at the IV—IV line of FIG. 1.

Referring now to the drawings, a description of preferred embodiments of the present invention will be given in detail.

In a first embodiment of the present invention, there is provided a reflowed BPSG film spacer or a reflowed PSG film spacer at a side of a self align contact hole. Moreover, at least on a surface of a middle wiring layer exposed by the self align contact hole, the side of the self align contact hole is not covered directly by the BPSG film spacer etc., is covered by the BPSG film spacer via a silicon oxide film.

As an example, the first embodiment of the present invention is explained by a COB structure DRAM whose bit contact hole and node contact hole are made of self align contact holes, however an application of the first embodiment of the present invention is not limited to the bit contact hole and the node contact hole of the DRAM, this is applicable for the whole structure of multilayer wiring. At the time of the above structured DRAM is formed on a P type silicon substrate, for the bit contact hole, a lower wiring layer, a middle wiring layer and an upper wiring layer are made of an end of a N type source drain area, a gate electrode also served as a word line and a bit line, an insulation film provided on a surface of a P type silicon substrate is made of a field oxide film and a gate oxide film, an insulation film between layers covering the middle wiring layer is made of a first insulation film between layers covering the gate electrode, the field oxide film and the gate oxide film. For the node contact hole, the lower wiring layer is made of an another end of the N type source drain area, the middle wiring layer is made of the gate electrode and the the bit line, the upper wiring layer is made of a storage node electrode, insulation films provided on a surface of the P type silicon substrate are made of the field oxide film and the gate oxide film, an insulation films between layers covering the middle wiring layer are made of the first insulation film, the bit line and a second insulation film between layers covering the first insulation film between layers.

Figure 6:
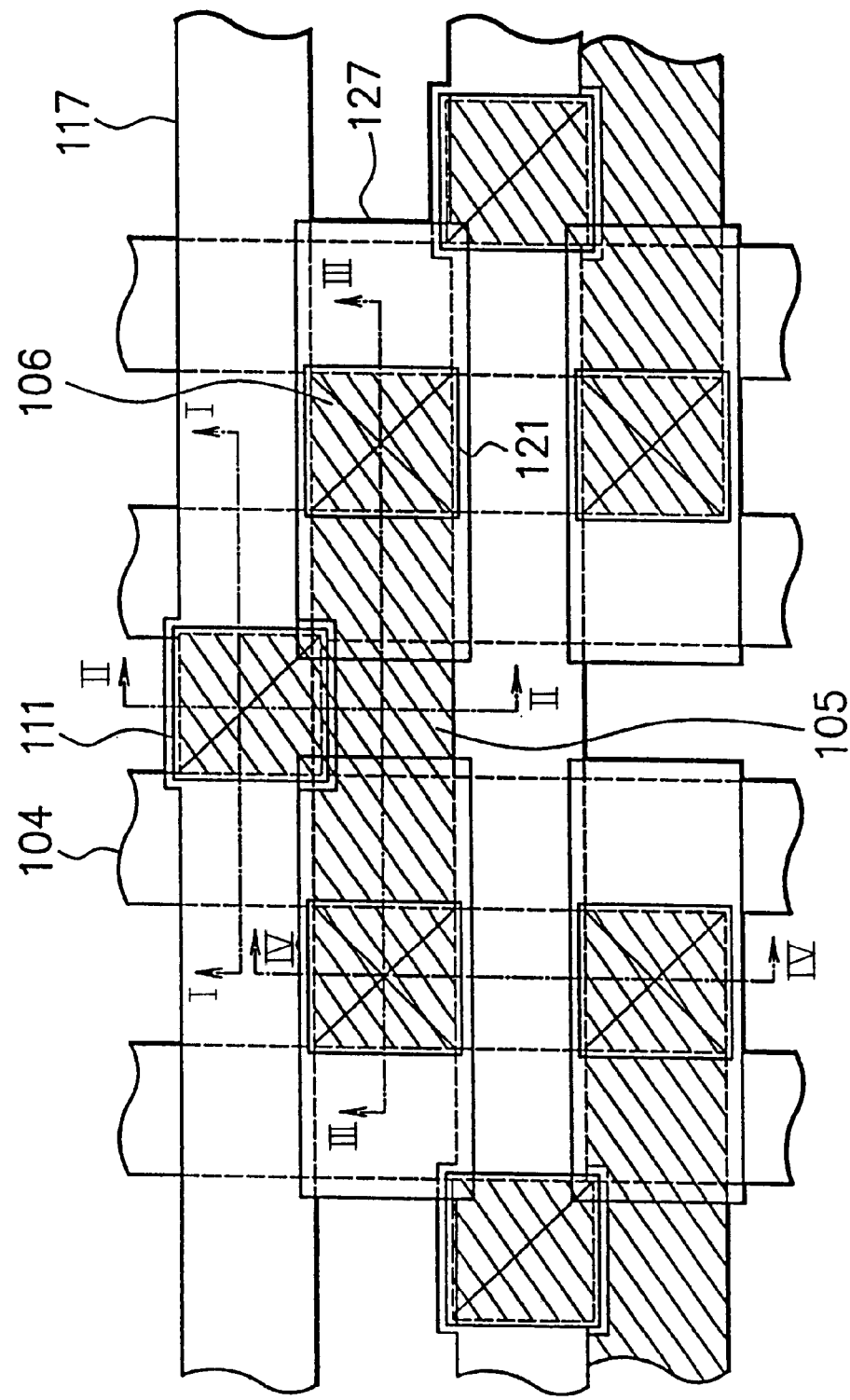
FIG. 6 is a plan view of a first example of a first embodiment of the present invention.
Figure 7A:
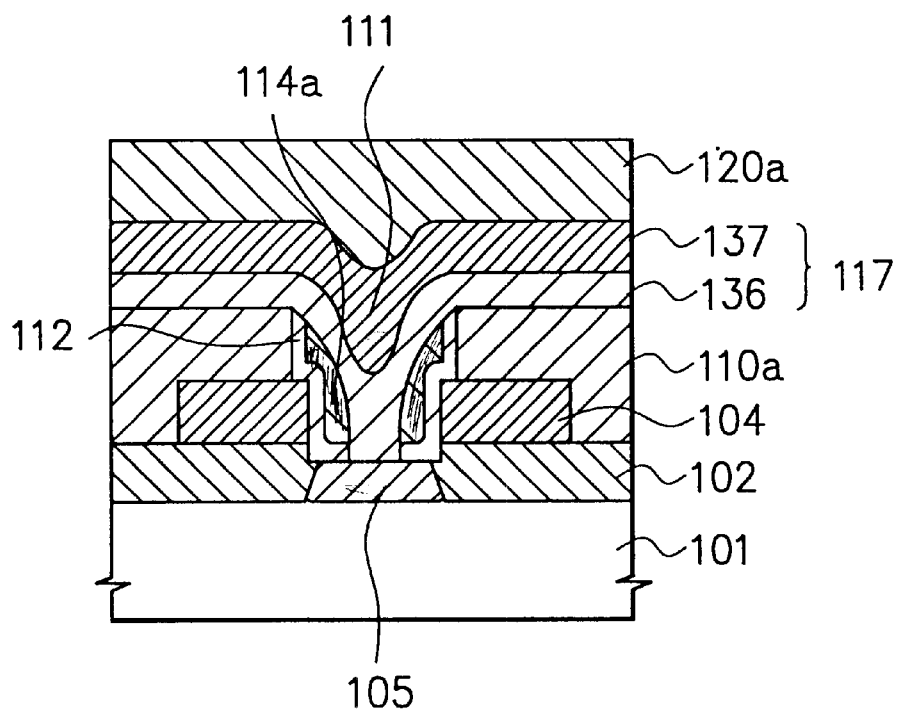
FIG. 7A is a section view of the first example of the first embodiment of the present invention at the I—I line of FIG. 6.
Figure 7B:
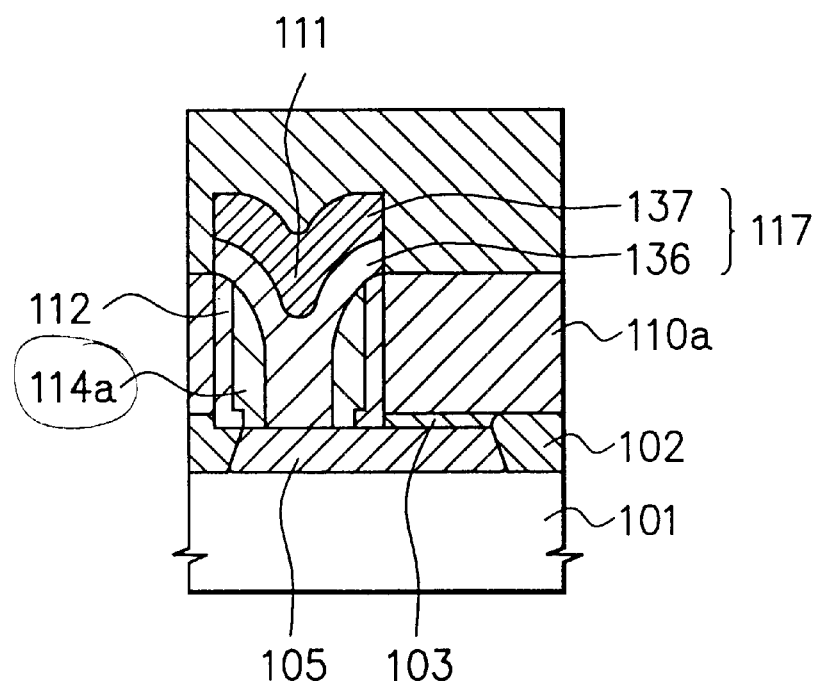
FIG. 7B is a section view of the first example of the first embodiment of the present invention at the II—II line of FIG. 6.
Figure 8A:
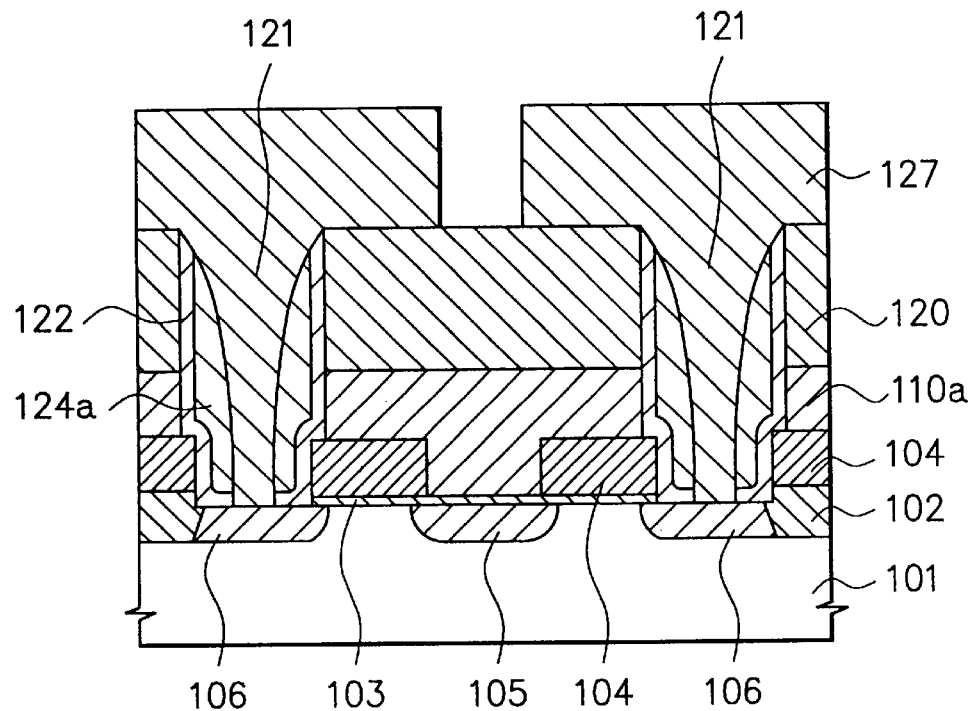
FIG. 8A is a section view of the first example of the first embodiment of the present invention at the III—III line of FIG. 6.
Figure 8B:
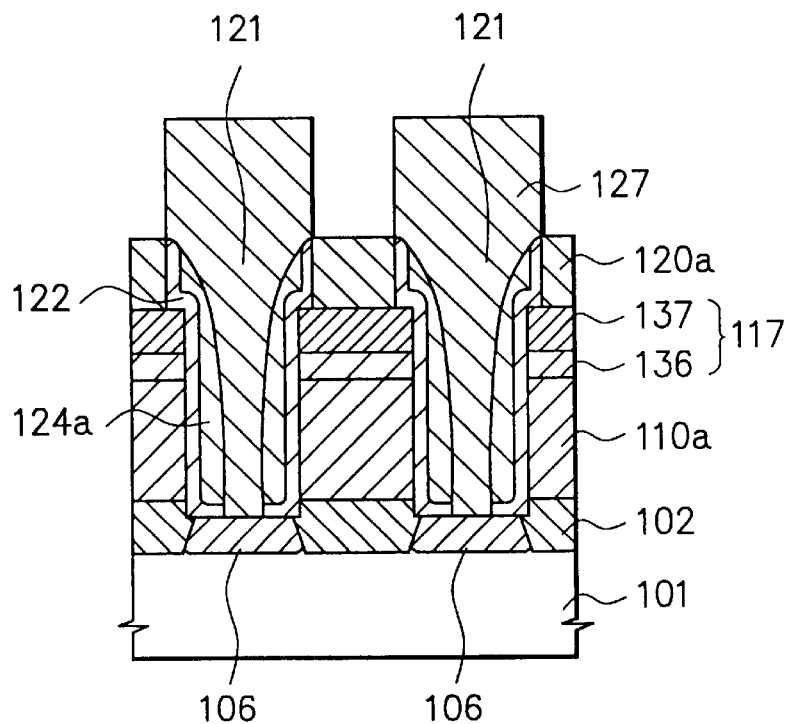
FIG. 8B is a section view of the first example of the first embodiment of the present invention at the IV—IV line of FIG. 6.

Referring to FIG. 6 showing a plan view of the COB structure DRAM, FIGS. 7A and 7B showing section views at the I—I line and the II—II line of FIG. 6 and FIGS. 8A and 8B showing section views at the III—III line and the IV—IV line of FIG. 6, at the DRAM having the self align contact hole of a first example of the first embodiment, the minimum processing measure is 0.3 $\mu$m and a wiring pitch is 0.8 $\mu$m, a construction is shown below. An element forming area is hatched in FIG. 6 and a capacity insulation film constituting a capacitor and a cell plate electrode are omitted in FIGS. 6, 7A, 7B, 8A and 8B.

On the surface of the P type silicon substrate 101, T formed element forming areas are disposed regularly and a gate oxide film 103 with about 10 nm thickness is provided. On the surface of the P type silicon substrate 101, at an element separation area surrounding these element forming areas, for example, a LOCOS type field oxide film 102 with about 300 nm thickness is provided. On the surface of the field oxide film 102 and the gate oxide film 103, gate electrodes 104 also served as a word line are disposed in parallel in a required direction. A line width and an interval of these gate electrodes are for example about 0.4 $\mu$m respectively, these gate electrodes 104 are constituted of a tungsten polycide film laminated a tungsten silicide film with about 150 nm thickness to an N type polycrystal silicon film (omitted in FIGS.) with about 100 nm thickness. On the surface of the P type silicon substrate 101 of each element forming area, one N type source drain area 105 and two N type source drain areas 106 are provided in self matching for the gate electrode 104 and the field oxide film 102. The minimum line width and the minimum interval of the N type source drain area 105 and 106 are about 0.4 $\mu$m respectively.

The surface of the P type silicon substrate 101 including the gate electrode 104, the field oxide film 102 and the gate oxide film 103 is covered an insulation film between layers 110a made of a kind of silicon oxide insulation film. An upper surface of the insulation film between layers 110a is flattened, a thickness of the insulation film between layers 110a from the surface of the P type silicon substrate 101 is about 50 nm. The upper surface of the insulation film between layers 110a and a bottom face of the insulation film between layers 110a covering directly the gate electrode 104 are at least formed by silicon oxide films.

At the insulation film between layers 110a, a bit contact hole 111 which reaches the N type source drain area 105 penetrating the insulation film between layers 110a and the gate oxide film 103 from this insulation film between layers 110a is provided. The bit contact hole 111 is formed in self matching for the gate electrode 104 and penetrates the insulation film between layers 110a at a vacant part of the gate electrode 104. A bore of an upper end of the bit contact hole 111 at the upper surface of the insulation film between layers is about 0.5 μm, however a minimum bore of the bit contact hole 111 at a lower place than the upper surface of the gate electrode 104 and at an orthogonal direction to the gate electrode 104 is about 0.4 μm and the same as an interval of the gate electrode 104. The upper surface and a part of side of the gate electrode 104 are exposed by these bit contact holes 111.

The side of the bit contact hole 111 is directly covered with a silicon oxide film spacer 112, this silicon oxide film spacer 112 is a first insulation film spacer. Moreover, a surface of a silicon oxide film spacer 112 is covered by a BPSG film spacer 114a, this BPSG film spacer 114a is made of a BPSG film reflowed by heat treatment and is a second insulation film spacer. The maximum thickness of the BPSG film spacer 114a is about 100 nm. At a surface of the N type source drain area 105 in a place of a bottom face of the bit contact hole 111, the silicon oxide film spacer 112 is opened to the BPSG film spacer in self matching for the BPSG film spacer 114a. The reason why the silicon oxide film spacer 112 is provided is to prevent boron B and phosphorus P diffusing to the gate electrode 103 exposed to the bit contact hole 111 and the surface of the N type source drain area 105 from the BPSG film spacer 114a (FIGS. 7A and 7B).

On the surface of the insulation film between layers 110a, a bit line 117 connected to the N type source drain area 105 via the bit contact hole 111 is provided in parallel in an orthogonal direction of the gate electrode 104. The bit line 117, like the gate electrode 104, is constituted of a tungsten polycide film laminated a tungsten silicide film 137 with about 150 nm thickness to an N type polycrystal silicon film 136 with about 100 nm thickness. A wiring pitch of the bit line 117 is about 0.8 μm, a line width and an interval of the bit line 117 at a place of the bit contact hole 111 are about 0.5 μm and 0.3 μm respectively, a line width and a interval of the bit line 117 except the part of the bit contact hole 111 are 0.4 μm respectively. The surface of the insulation film between layers 110a including these bit lines 117 is covered by an insulation film between layers 120a made of a kind of silicon oxide insulation film. An upper surface of the insulation film between layers 120a is also flattened and the thickness of the insulation film between layers 120a from the surface of the insulation film between layers 110a is about 350 nm. The upper surface of the insulation film between layers 120a and the bottom face of the insulation film between layers 120a covering directly the bit line 117 is at least made of a silicon oxide film (FIGS. 6, 7A and 7B).

At the insulation film between layers 120a, a node contact hole 121 which reaches the N type source drain area 106 penetrating the insulation film between layers 120a, 110a and the gate oxide film 103 from the surface of the insulation film between layers 120a is provided. A node contact hole 121 is formed in self matching for the bit line 117 and penetrates the insulation film between layers 120a of a vacant part of the bit line 117, moreover is formed in self matching for the gate electrode 104 and penetrates the insulation film between layers 110a of a vacant part of the gate electrode 104. A bore at an upper end of the node contact hole 121 in the upper surface of the insulation film between layers 120a is about 0.5 μm, a minimum bore of the node contact hole 121 between the upper surface of the bit line 117 and the upper surface of the gate electrode 104 is about 0.4 μm and a bore of the node contact hole 121 at the lower place than the upper surface of the gate electrode 104 is about 0.4 μm. By these node contact holes 121, a part of the side and the upper surface of the bit line 117 and a part of the side and the upper surface of the gate electrode 104 are exposed.

The side of the node contact hole 121 is directly covered by a silicon oxide film spacer 122 with about 30 nm thickness being a first insulation film spacer. Moreover, the surface of the silicon oxide film spacer 122 is covered by a BPSG film spacer 124a, this BPSG film spacer 124a is made of a BPSG film reflowed by heat treatment and is a second insulation film spacer. The maximum thickness of the BPSG film spacer 124a is about 100 nm. At the surface of the N type source drain area 106 which is to be a bottom face of the node contact hole 121, the silicon oxide film spacer 122 is opened in self matching for the BPSG film spacer 124a. To provide the silicon oxide film spacer 122 is to prevent boron B and phosphorus P diffusing to the bit line 117 exposed by the node contact hole 121, the gate electrode 103 and the surface of the N type source drain area 105 from the BPSG film spacer 124a (FIGS. 8A and 8B).

On the surface of the insulation film between layers 120a, a storage node electrode 127 connecting to the N type source drain area 106 via the node contact hole 121 is provided. The storage node electrode 127 is constituted of an N type polycrystal silicon film with about 700 nm thickness on the upper surface of the insulation film between layers 120a. A long length direction of the storage node electrode 127 is the bit line 117 in parallel, the length, width and interval of the storage node electrode 127 are about 1.3 μm, 0.5 μm and 0.3 μm respectively, the pitches of the storage node electrode 127 in the parallel direction with the bit line 117 and the gate electrode 104 are about 1.6 μm and 0.8 μm respectively. Drawings are omitted, however on the exposed surface of the storage node electrode 127 and the insulation film between layers 120a, a capacity insulation film is provided, on the surface of the capacity insulation film, a cell plate electrode is provided (FIGS. 6, 8A and 8B).

Referring to FIGS. 6, 7A, 7B, 8A and 8B and FIGS. 9A to 9C, 10A to 10C, 11A to 11C and 12A to 12C showing section views of manufacturing process at the lines I—I, II—II, III—III and IV—IV of FIG. 6, an outline of a manufacturing process of the DRAM of a first example of a first embodiment of the present invention is explained below. The alignment margin is about 50 nm at this photo lithography.

First, for example by selective oxidation, the field oxide film 102 with about 300 nm thickness is formed on the element separation area of the surface of the P type silicon substrate 101, by heat oxidation the gate oxide film 103 with about 10 nm thickness is formed on the element forming area of the surface of the P type silicon substrate 101. On the whole surface an N type polycrystal silicon film with about 100 nm thickness and a tungsten silicide film with about 150 nm are formed in order and these tungsten silicide film and N type polycrystsl silicon film are patterned by an anisotropic etching in order, and a gate electrode 104 is formed. By an ion injection of arsenic etc. used the gate electrode 104 and the field oxide film 102 as masks, the N type source drain area 105 and 106 are formed on the element forming area of the surface of the P type silicon substrate 101. For example, a HTO film by a high temperature vapor phase grown method and a BPSG film made from TEOS as a main gas material are formed on the whole surface. The concentration of phosphorus and boron at this BPSG film are for example about 4.2 mol % and 9.4 mol % respectively. The BPSG film is reflowed by heat treatment about 850° C., moreover after the surface of the BPSG film is flattened by CMP, the silicon oxide film with about 100 nm thickness is formed on the whole surface, a first insulation film between layers 110 with about 520 nm thickness is formed, this 520 nm thickness corresponds to the height from the P type silicon substrate 101.

Figure 9A:
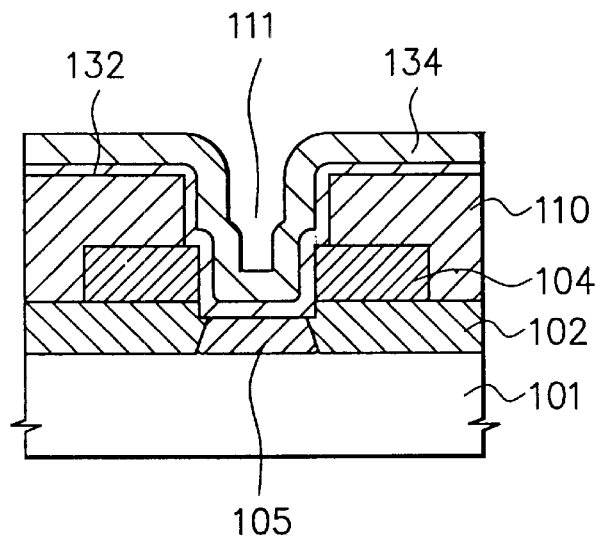
FIG. 9A is a section view showing a manufacturing process of the first example of the first embodiment of the present invention at the I—I line of FIG. 6.
Figure 10A:
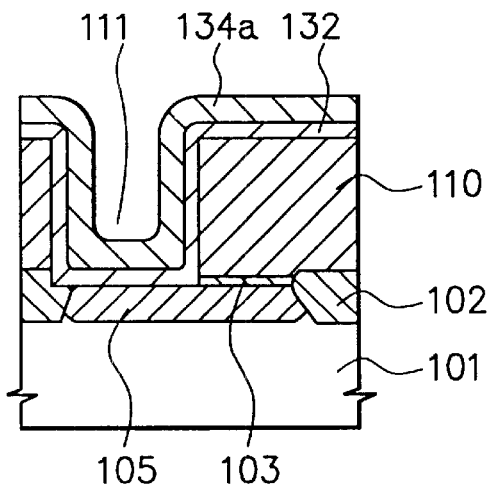
FIG. 10A is a section view showing a manufacturing process of the first example of the first embodiment of the present invention at the II—II line of FIG. 6.

Next, by a high selectivity anisotropic etching for the polycrystal silicon film and the tungsten silicide film etc. using a photo resist pattern as a mask, the insulation film between layers 110 and the gate oxide film 103 are etched in order, the bit contact hole 111 reaching the N type source drain area 105 from the upper surface of the insulation film between layers 110 is formed. At this time, a slit width of the upper surface of the gate electrode 104 exposed by the bit contact hole 111 is about 50 nm disregarding an alignment margin. By LPCVD using TEOS ($Si(OC_2H_5)_4$) and oxygen $O_2$ as materials, a silicon oxide film 132 with about 30 nm thickness is formed on the whole surface. The reason to select LPCVD for forming the silicon oxide film 132, a covering performance of difference in level of LPCVD is excellent. Moreover, by LPCVD using TEOS, TMP ($PO(OCH_3)_3$), TMB ($B(OCH_3)_3$) and $O_2$ as materials, a BPSG film 134a with about 100 nm thickness is formed on the whole surface. For the surface of the N type source drain area 105 exposed by the bit contact hole 111 and the gate electrode 104, to prevent the diffusion of phosphorus and boron from the BPSG film 134 by the silicon oxide film 132, the thickness of the silicon oxide film 132 even in case formed by CVD is about 30 nm enough. The concentration of phosphorus and boron of the BPSG film 134a is lower than that of the BPSG film constituting of the insulation film between layers 110 and for example is about 2.5 mol % and 4.3 mol % respectively. At this process, on the surface of the BPSG film 134a covering the side of the bit contact hole 111, the step part shape based on the gate electrode 104 at the part exposed by the bit contact hole 111 still remains, is even lessened (FIGS. 9A and 10A).

Figure 9B:
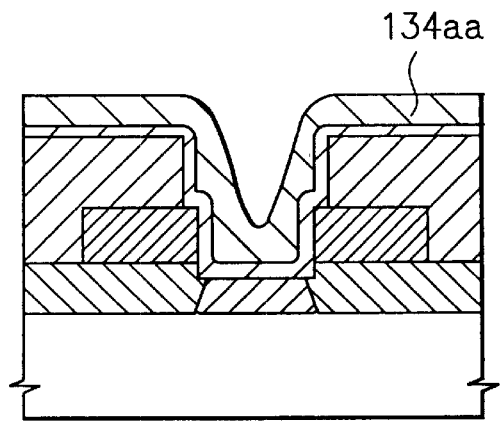
FIG. 9B is a section view showing a manufacturing process of the first example of the first embodiment of the present invention at the I—I line of FIG. 6.
Figure 9C:
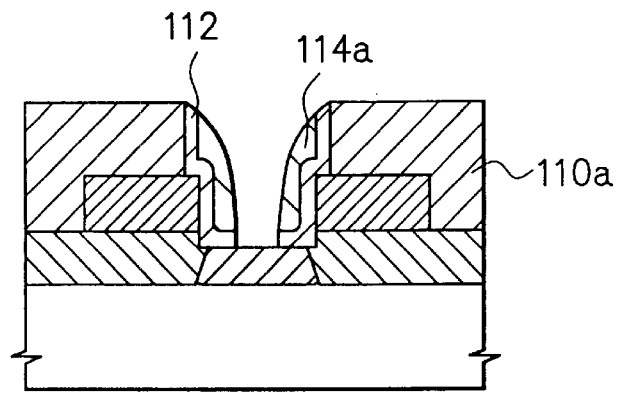
FIG. 9C is a section view showing a manufacturing process of the first example of the first embodiment of the present invention at the I—I line of FIG. 6.
Figure 10B:
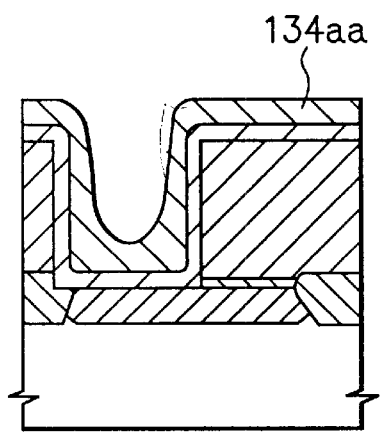
FIG. 10B is a section view showing a manufacturing process of the first example of the first embodiment of the present invention at the II—II line of FIG. 6.
Figure 10C:
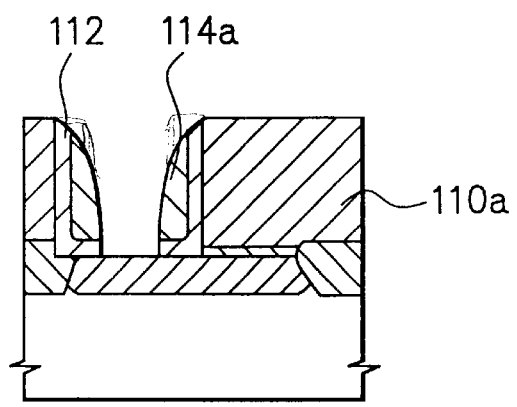
FIG. 10C is a section view showing a manufacturing process of the first example of the first embodiment of the present invention at the II—II line of FIG. 6.

For example, by heat treatment in about 850° C. nitrogen $N_2$ ambience for about 10 minutes, a BPSG film 134aa is formed by the BPSG film 134a reflowed. By this heat treatment, the surface of the BPSG film 134aa at the part covering the side of the bit contact hole 111 is hardly influenced by the step part shape base on the gate electrode 104 at the part exposed by the bit contact hole 111. As mentioned above, by setting the concentration of phosphorus and boron of the BPSG film 134a and the BPSG film 134aa lower than that of the BPSG film constituting the insulation film between layers 110, at the time of this reflowing, controlling not to make the thickness of the BPSG film 134aa thicker at the right above the bottom face of the bit contact hole 111 becomes easy (FIGS. 9B and 10B).

Next, by the etch back the BPSG film 134aa and the silicon oxide film 132 in order, by an anisotropic etching, the oxide silicon film spacer 112 covering directly the side of the bit contact hole 111 and the BPSG film spacer 114a covering directly the surface of the silicon oxide film spacer 112 are formed. With this, the insulation film between layers 110 is also etch backed and becomes an insulation film between layers 110a with about 500 nm thickness. This anisotropic etching, for example at the 10 Pa degree of vacuum and 1850 W power, is implemented using a mixed gas of 32 sccm tetrafluoromethane $CF_4$ and 88 sccm trifluoromethane $CHF_3$ as etching gases. A mixed gas of $CF_4$ and carbon monoxide $CO$, octafluorocyclobutane $C_4F_8$ and CO, etc. is usable as an etching gas. On the bottom face of the bit contact hole 111, the minimum width of the N type source drain area 105 not covered and exposed by the silicon oxide film spacer 112 is about 140 nm. At the near part of the step part of the gate electrode 104 exposed by the bit contact hole 111, the width of the BPSG film spacer 114a is about 30 nm to 50 nm, this small change of the width is not caused by the small change of the alignment accuracy at a process of photo lithography and caused under the attenuation/reduction (FIGS. 6, 7A, 7B, 9C and 10C).

After the above process, an N type polycrystal silicon film 136 with about 100nm thickness is formed by LPCVD etc. on the whole surface. A tungsten silicide film 137 with about 150 nm thickness is formed on the whole surface. By an anisotropic etching, the tungsten silicide film 137 and the N type polycrystal silicon film 136 are patterned in order, a bit line 117 connecting to the N type source drain area 105 via the bit contact hole 111 is formed. The reason why the N type polycrystal silicon film 136 is included in the constitution of the bit line 117 is that the N type polycrystal silicon film 136 formed by LPCVD included has the excellent covering performance of the difference in level at the bit contact hole 111 and also that the reliability problem is prevented by the direct contact of the tungsten silicide film 137 to the BPSG film spacer 114a (FIGS. 6, 7A and 7B).

The insulation separation between the bit line 117 filling the bit contact hole 111 and the gate electrode 104 is implemented by a laminated insulation film spacer made of the silicon oxide film spacer 112 and the BPSG film spacer 114a. The thinnest part of this laminated insulation film spacer is the part covering the near part of the step part by the gate electrode 104 exposed by the bit contact hole 111 and the film thickness of this part is about 60 nm to 80 nm. The film thickness required for the insulation separation between the bit line 117 and the gate electrode 104 is about 30 nm enough, there is no problem about the insulation separation at the near part of the step part.

Figure 11A:
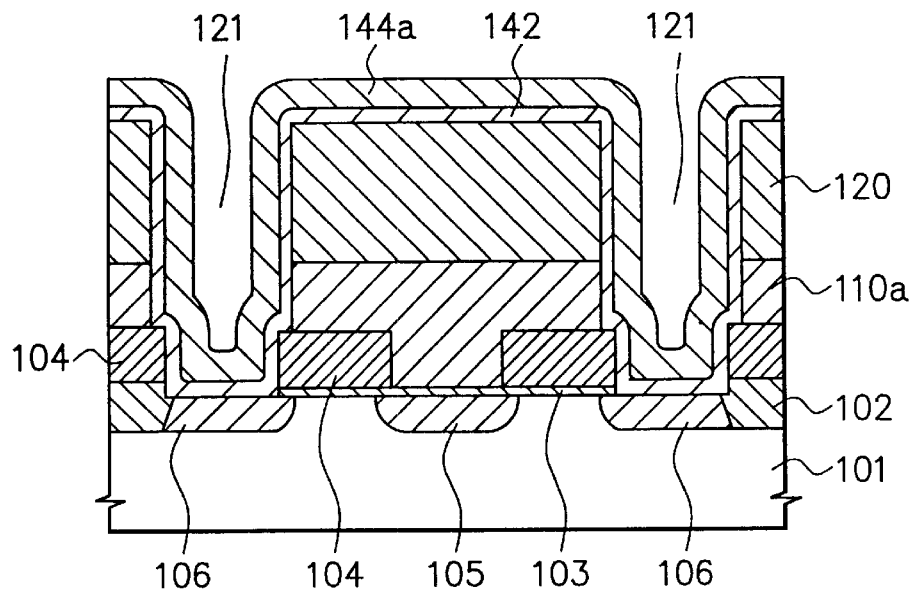
FIG. 11A is a section view showing a manufacturing process of the first example of the first embodiment of the present invention at the III—III line of FIG. 6.
Figure 12A:
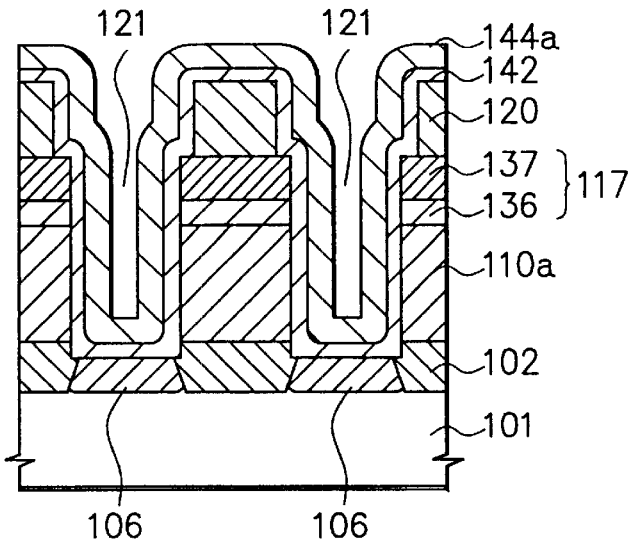
FIG. 12A is a section view showing a manufacturing process of the first example of the first embodiment of the present invention at the IV—IV line of FIG. 6.

Then, by the same method of said insulation film between layers 110, an insulation film between layers 120 with about 370 nm thickness is formed. After this, by the same anisotropic etching formed said bit contact hole 111, insulation film between layers 120 and 110a and the gate oxide film 103 are etched in order, a node contact hole 121 reaching to N type source drain area 106 from the upper surface of the insulation film between layers 120 is formed. At this time, the slit widths of the upper surfaces of the bit line 117 exposed by the node contact hole 121 and the gate electrode 104 are about 50 nm respectively disregarding the alignment margin. By LPCVD, on the whole surface a silicon oxide film 142 with about 30 nm thickness and a BPSG film 144a with about 100 nm thickness are formed in order. The concentration of phosphorus and boron of the BPSG film 144a is thinner than that of the insulation film between layers 134a and is set for example about 1.8 mol % and about 3.9 mol % respectively. At this process, on the surface of the BPSG film 144a at the part covering the side of the node contact hole 121, the step part shape based on the bit line 117 at the part exposed by the node contact hole 121 and the gate electrode 104 is even lessen but remains (FIGS. 11A and 12A).

Figure 11B:
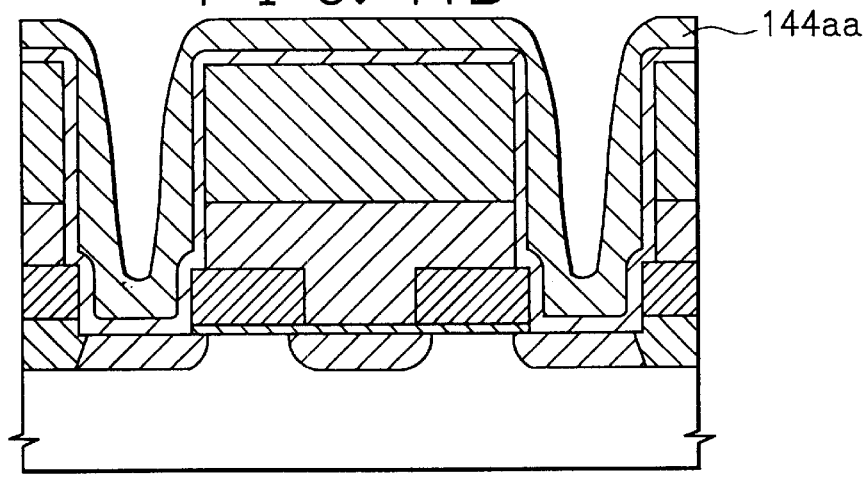
FIG. 11B is a section view showing a manufacturing process of the first example of the first embodiment of the present invention at the III—III line of FIG. 6.
Figure 11C:
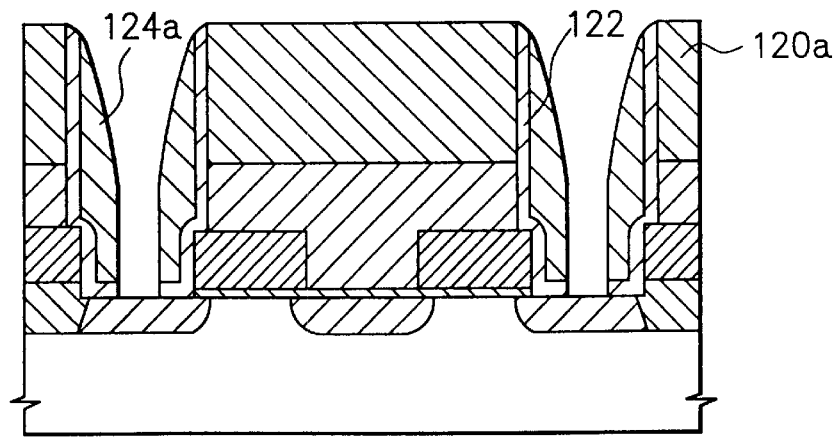
FIG. 11C is a section view showing a manufacturing process of the first example of the first embodiment of the present invention at the III—III line of FIG. 6.
Figure 12B:
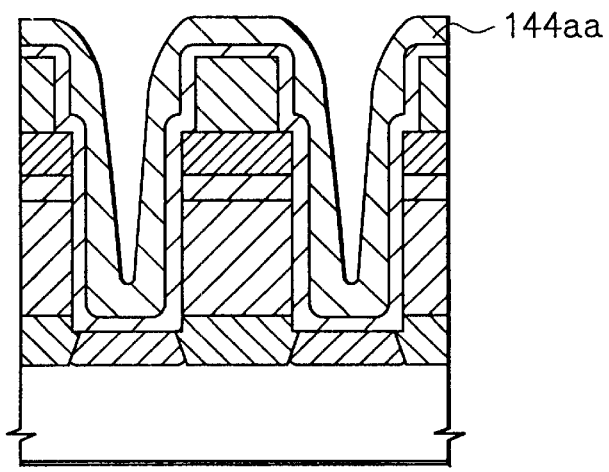
FIG. 12B is a section view showing a manufacturing process of the first example of the first embodiment of the present invention at the IV—IV line of FIG. 6.
Figure 12C:
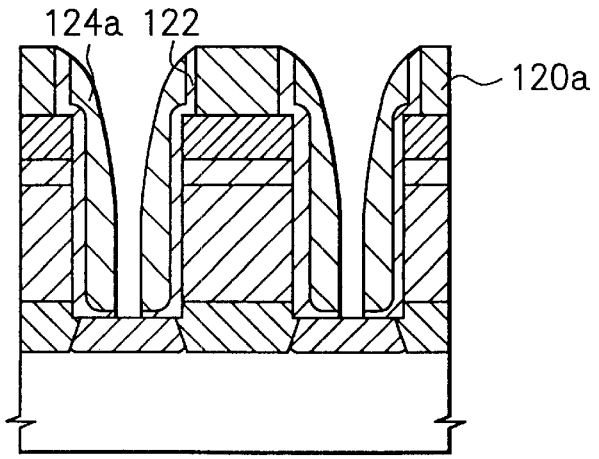
FIG. 12C is a section view showing a manufacturing process of the first example of the first embodiment of the present invention at the IV—IV line of FIG. 6.

Next, for example by the heat treatment of about 800° C. in $N_2$ ambience for about 30 minutes, the BPSG film 144a is reflowed and turned to a BPSG film 144aa. With this heat treatment, the surface of the BPSG film 144aa at the part covering the side of the node contact hole 121 is hardly influenced by the step part shape based on the bit line 117 at the part exposed by the node contact hole 121 and the gate electrode 104. As mentioned above, compared with the BPSG film constituting the BPSG film 134a, the reason why the concentration of phosphorus and boron of the BPSG film 144a and the BPSG film 144aa is set in lower is that the aspect ratio of the node contact hole 121 is higher than that of the bit contact hole 111, with this process the control of the thickness of the BPSG film 144aa at the right above of the bottom face of the node contact hole 121 becomes easy (FIGS. 11B and 12B).

After this, the BPSG film 144aa and the silicon oxide film 142 are etch backed in order by an anisotropic etching, a silicon oxide film spacer 122 covering directly the side of the node contact hole 121 and a BPSG film spacer 124a covering directly the surface of the silicon oxide film spacer 122 are formed. With this, the insulation film between layers 120 is also etch backed and turns to an insulation film between layers 120a with about 350 nm thickness. At the bottom face of the node contact hole 121, the N type source drain area 106 that is not covered and exposed by the silicon oxide film spacer 122 and the BPSG film spacer 124a is a square with about 140 nm one side length. At the near part of the step part by the bit line 117 exposed by the node contact hole 121 and the gate electrode 104, the width and thickness of the BPSG film spacer 124a are about 20 nm to 40 nm and about 30 nm to 50 nm respectively. The thicknesses at these parts as the laminated insulation film spacer are about 50 nm to 70 nm and about 60 nm to 80 nm respectively and all is over 30 nm thickness and the insulation performance is obtained at these parts (FIGS. 6, 8A, 8B, 11C and 12C).

Next, by LPCVD using monosilane $SiH_4$ and phosphine $PH_3$ as gas materials, an N type amorphous or polycrystal silicon film with about 700 nm thickness is formed on the whole surface. This silicon film is patterned and a heat treatment is applied for this at before and after, a storage node electrode 127 made of an N type polycrystal silicon film is formed. The storage node electrode 127 connects to the N type source drain area 106 via the node contact hole 121 (FIGS. 6, 8A and 8B). After this, a capacity insulation film is formed on the whole surface, moreover a cell plate electrode is formed.

In the first example of the first embodiment of the present invention, the insulation separation at the nearest part between the bit line 117 connecting to the source drain area 105 via the bit contact hole 111 and the gate electrode 104 is not made by the silicon nitride film cap and the silicon nitride film spacer set on the upper surface and side of the gate electrode 104 after a complicated wiring manufacturing process, is made by the laminated insulation film spacer of the silicon oxide film spacer 112 with about 30 nm thickness and the BPSG film spacer 114a with about 30 nm to 50 nm thickness. As a result, deterioration of the insulation characteristics at this part between the bit line 117 and the gate electrode 104 is lessened, moreover a fear of electric charge storage to the insulation film spacer is solved. The matter among the storage node electrode 127 connecting to the N type source drain area 106 via the node contact hole 121, the bit line 117 and the gate electrode 104 is the same as the matter between the bit line 117 connecting to the N type source drain area 105 via the bit contact hole 111 and the gate electrode 104.

At the first example of the first embodiment of the present invention, the COB structure DRAM having the bit contact hole and the node contact hole made of the self align contact hole respectively as an example, the first example of the first embodiment of the present invention is applicable to a self align contact hole at a general multilayer wiring structure.

Moreover, at the first example of the first embodiment of the present invention, the BPSG film spacer is explained as an example, the example is not limited to this, instead of the BPSG film spacer a PSG film spacer is adoptable. The first example of the first embodiment of the present invention is not limited to the above mentioned various numeral values.

In the first example of the first embodiment of the present invention, on the sides of the bit contact hole and node contact hole which are the bit contact holes, there is provided a laminated insulation film spacer laminating the first insulation film spacer made of the silicon oxide film spacer and the second insulation film spacer made of for example reflowed BPSG film respectively, however the first embodiment of the present invention is not limited to this.

Figure 13A:
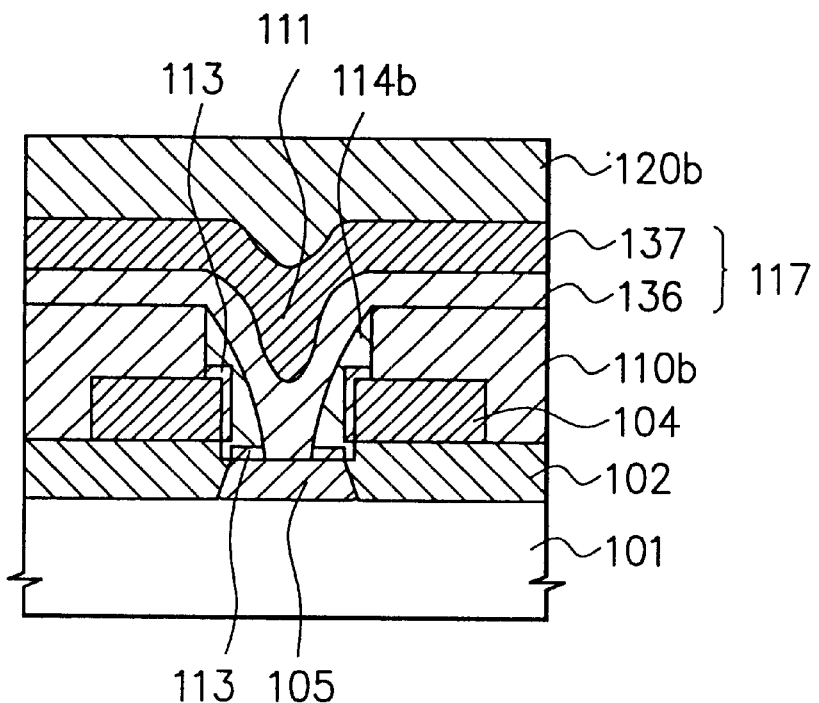
FIG. 13A is a section view showing a related part of a bit contact hole of DRAM of a second example of the first embodiment of the present invention.
Figure 13B:
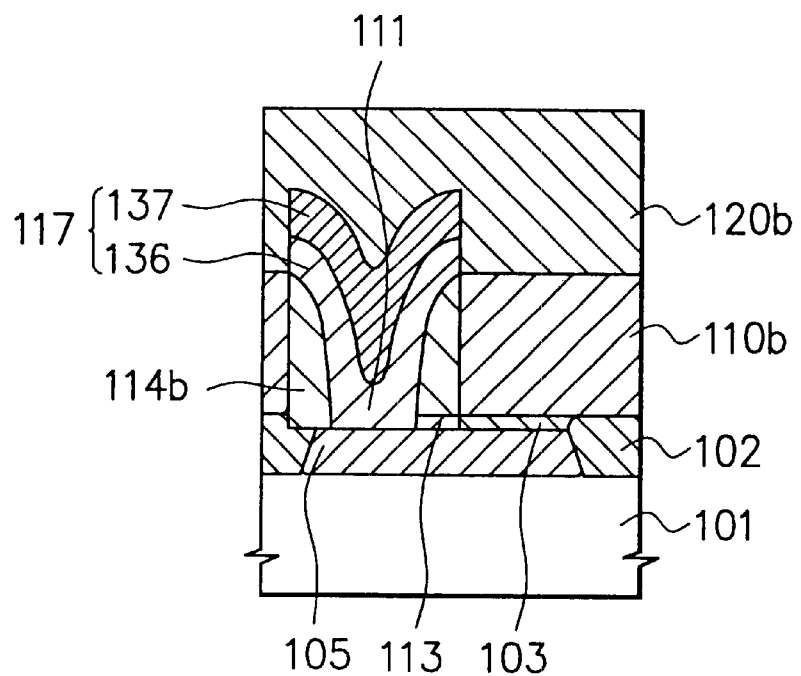
FIG. 13B is a section view showing a related part of a bit contact hole of DRAM of the second example of the first embodiment of the present invention.
Figure 14A:
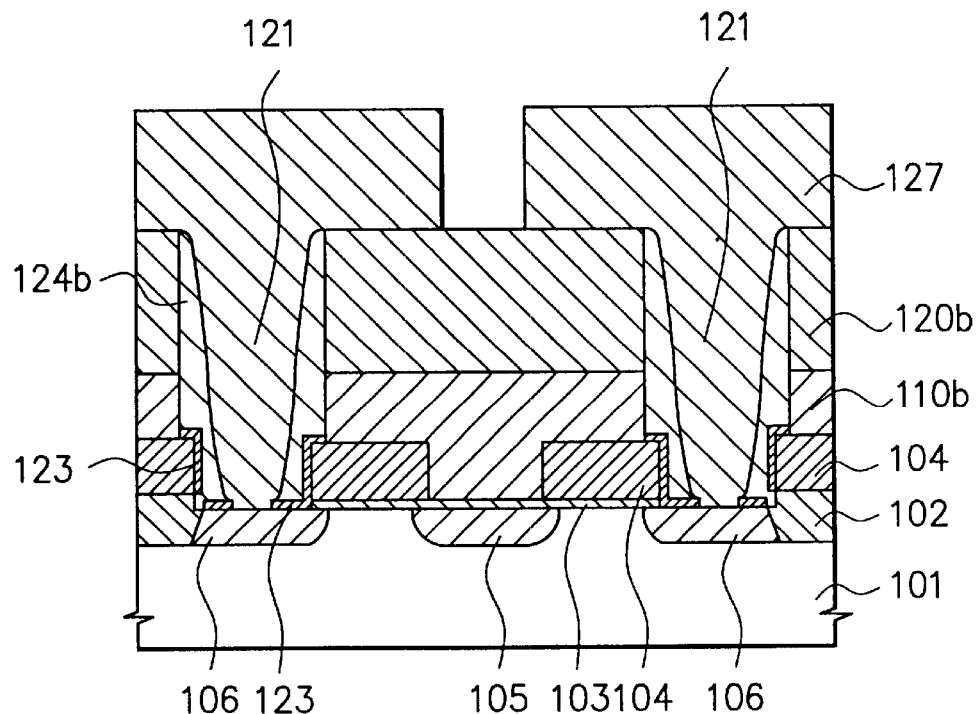
FIG. 14A is a section view showing a related part of a node contact hole of DRAM of the second example of the first embodiment of the present invention.
Figure 14B:
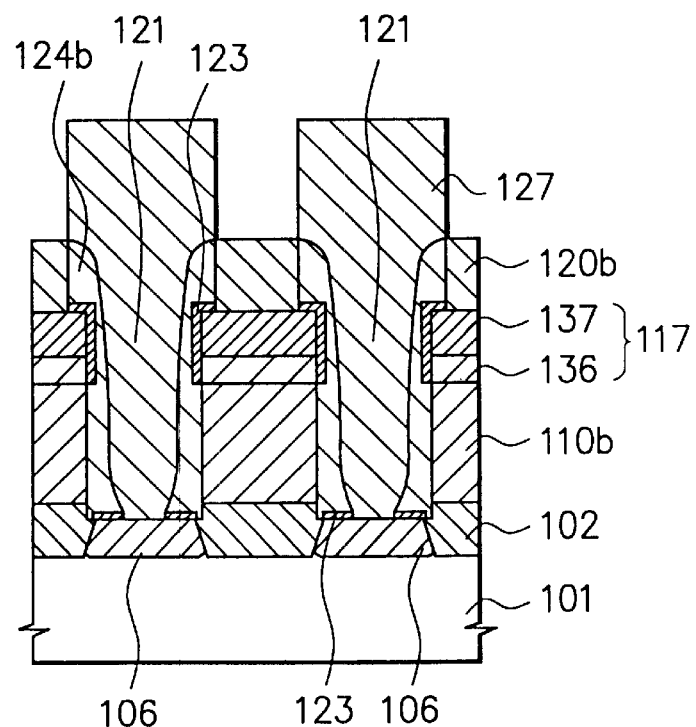
FIG. 14B is a section view showing a related part of a node contact hole of DRAM of the second example of the first embodiment of the present invention.

Referring to FIGS. 13A and 13B showing a section view including the part of the bit contact hole of the COB structure DRAM and FIGS. 14A and 14B showing a section view including the part of node contact hole of the DRAM, a second example of the first embodiment of the present invention is explained. The plan view of the second example of the first embodiment of the present invention is the same as that of the first example of the first embodiment of the present invention, then the plan view is omitted. FIGS. 13A and 13B are section views corresponding to the I—I line and II—II line of FIG. 6, FIGS. 14A and 14B are section views corresponding to the III—III line and IV—IV line of FIG. 6.

The difference of the second example of the first embodiment compared with the first example is the following two points. The first point is that the insulation film spacer made of the silicon oxide film spacer covering the side of the self align contact hole does not exist and is only made of the BPSG film spacer. The second point is that the silicon oxide film on the exposed surface of the middle wiring layer and the lower wiring layer formed by the self align contact hole is formed selectively, moreover said silicon oxide film spacer formed selectively on said exposed surface of the lower wiring layer which is the bottom face of the self align contact hole is opened to the BPSG film in self matching.

The same as the first example of the first embodiment of the present invention, on the surface of the P type silicon substrate 101, T formed element forming area is disposed regularly and on the surface of the P type silicon substrate 101 which is the element forming area the gate oxide film 103 with about 10 nm thickness is provided. On the surface of the P type silicon substrate 101 which is the element separation area surrounding the element forming area, the field oxide film 102 with about 300 nm thickness is provided. On the surface of the field oxide film 102 and the gate oxide film 103, the gate electrode 104 is provided. The line width and the interval of the gate electrode 104 are for example about 0.4 µm respectively, these gate electrodes 104 are constituted of the tungsten polycide films laminated the tungsten silicide film with about 150 nm thickness to the N type polycrystal silicon film with about 100 nm. On the surface of the P type silicon substrate 101 of each element forming area, the N type source drain area 105 and 106 are provided to the gate electrode 104 and the field oxide film 102 in self matching. The minimum line width and the minimum interval of the N type source drain area 105 and 106 are about 0.4 µm respectively.

The surface of the P type silicon substrate 101 including the gate electrode 104, the field oxide film 102 and the gate oxide film 103 is covered by the insulation film between layers 110b made of a kind of the silicon oxide insulation film. The upper surface of the insulation film between layers 110b is flattened and the thickness of the insulation film between layers 110b from the P type silicon substrate 101 is about 500 nm. The upper surface of the insulation film between layers 110b and the bottom face of the insulation film between layers 110b covering directly the gate electrode 104 is constituted of at least the silicon oxide film.

At the insulation film between layers 110b, the bit contact hole 111 reaching the N type source drain area 105 penetrating the insulation film between layers 110b and the gate oxide film 103 from the surface of this insulation film between layers 110b is provided. The bit contact hole 111 is formed in self matching for the gate electrode 104 and penetrates the insulation film between layers 110b of the vacant part of the gate electrode 104. A bore at the upper end of the bit contact hole 111 is about 0.5 μm, however the minimum bore of the bit contact hole at the lower place than the upper surface of the gate electrode 104 is the same as the interval of the gate electrode 104 and is about 0.4 μm. By these bit contact holes 111, a part of the upper surface and the side of the gate electrode 104 is exposed.

The exposed surface of the gate electrode 104 by the bit contact hole 111 is covered directly with the silicon oxide film 113 by heat oxidation with about 10 nm to 20 nm thickness, moreover a fixed part of the exposed surface of the N type source drain area 105 is also covered directly by the silicon oxide film 113. The side of the bit contact hole 111 is covered by a BPSG film spacer 114b which is an insulation film spacer made of a BPSG film reflowed by heat treatment. At said exposed surface of the N type source drain area 105 which becomes the bottom face of the bit contact hole 111, the silicon oxide film 113 is opened to the BPSG film spacer 114b in self matching, that is, said fixed part is the self matching part for the BPSG film spacer 114b. The concentration of phosphorus and boron of the BPSG film constituting the BPSG film spacer 114b are for example about 2.5 mol % and about 4.3 mol % respectively. The maximum thickness of the BPSG film spacer 114b is about 100 nm. The thickness of the BPSG film spacer 114b at the near part of the step part by the gate electrode 104 exposed by the bit contact hole 111 is about 30 nm to 50 nm, the sum of the thickness of the silicon oxide film 113 and the BPSG film spacer 114b at this part is about 40 nm to 70 nm. At the bottom face of the bit contact hole 111, the minimum width of the N type source drain area 105 not covered and exposed by the BPSG film spacer 114b is about 180 nm to 190 nm. The reason why the silicon oxide film 113 is provided is that the diffusion of boron and phosphorus from the BPSG film spacer 114b to the surface of the gate electrode 103 exposed by the bit contact hole 111 and the N type source drain area 105 is prevented, and the thickness of the silicon oxide film 113 is about 10 nm enough (FIGS. 13A and 13B).

On the surface of the insulation film between layers 110b, a bit line 117 connecting to the N type source drain area 105 via the bit contact hole 111 is provided. The bit line 117 is constituted of a tungsten polycide film laminated a tungsten silicide film 137 with about 150 nm thickness to an N type polycrystal silicon film 136 with about 100 nm. A wiring pitch of the bit line 117 is about 0.8 μm and a line width and an interval of the bit line 117 at the part of the bit contact hole 111 are about 0.5 μm and about 0.3 μm and a line width and an interval of the bit line 117 at the part excluded the bit contact hole 111 are 0.4 μm respectively. The surface of the insulation film between layers 110b including this bit line 117 is covered by an insulation film between layers 120b made of a kind of the silicon oxide insulation film. The upper surface of the insulation film between layers 120b is also flattened and the thickness of the insulation film between layers 120b from the surface of the insulation film between layers 110b is about 350 nm. The upper surface of the insulation film between layers 120b and the bottom face of the insulation film between layers 120b covering directly the bit line 117 are at least formed by a silicon oxide film (FIGS. 13A and 13B).

In the insulation film between layers 120b, a node contact hole 121 reaching the N type source drain area 106 penetrating the insulation film between layers 120b, 110b and the gate oxide film 103 from the surface of the insulation film between layers 120b is provided. The node contact hole 121 is formed in self matching for the bit line 117 and penetrates the insulation between layers 120b of the vacant part of the bit line 117 and is formed in self matching for the gate electrode 104 and penetrates the insulation between layers 110b of the vacant part of the gate electrode 104. A bore of the upper end of the node contact hole 121 at the upper surface of the insulation film between layers 120b is about 0.5 μm and the minimum bore of the node contact hole 121 from the upper surface of the bit line 117 to the upper surface of the gate electrode 104 is about 0.4 μm and a bore of the node contact hole 121 at the lower place than the upper surface of the gate electrode 104 is about 0.4 μm. The upper surface and a part of the side of the bit line 117 and the upper surface and a part of the gate electrode 104 are exposed by this node contact hole 121.

The exposed surfaces of the bit line 117 and gate electrode 104 by the node contact hole 121 are covered directly with the silicon oxide film 123 with about 10 nm to 20 nm thickness made by heat oxidation and a fixed part of the exposed surface of the N type source drain area 106 is also covered directly with the silicon oxide film 123. The side of the node contact hole 121 is covered with a BPSG film spacer 124b which is an insulation film spacer made of a BPSG film reflowed by heat treatment. At said exposed surface of the N type source drain area 106 becoming the bottom face of the node contact hole 121, the silicon oxide film 123 is opened in self matching for the BPSG film spacer 124b. The concentration of phosphorus and boron of the BPSG film constituting of the BPSG film spacer 124b is about for example 1.8 mol % and 3.9 mol %. The maximum thickness of the BPSG film spacer 124b is about 100 nm. The silicon oxide film 123 is provided to prevent the diffusion of boron and phosphorus to the surface of the gate electrode 103 exposed by the bit contact hole 111 and the N type source drain area 105 from the BPSG film spacer 114b (FIGS. 14A and 14 B).

On the surface of the insulation film between layers 120b, a storage node electrode 127 connecting to the N type source drain area 106 via the node contact hole 121 is provided. The storage node electrode 127 is constituted of an N type polycrystal silicon film with about 700 nm thickness on the upper surface of an insulation film between layers 320b. The long length direction of the storage node electrode 127 is in parallel to the bit line 117, the length, width and interval of the storage node electrode 127 are about 1.3 μm, 0.5 μm and 0.3 μm, the pitches of the storage node electrode 127 in a parallel direction of the bit line 117 and the gate electrode 104 are about 1.6 μm and about 0.8 μm. On the exposed surface of the storage node electrode 127 and the insulation film between layers 320a, a capacity insulation film is provided, on the surface of the capacity insulation film, a cell plate electrode is provided, however this drawing is omitted (FIGS. 14A and 14B).

Referring to FIG. 14A, FIGS. 15A, 15B and 15C and 16A and 16B showing section views of the manufacturing process at FIGS. 14B and 14A, also showing section views at the III—III line of FIG. 6, FIGS. 17A, 17B and 17C and 18A and 18B showing section views of the manufacturing process at FIG. 14B, also showing section views at the IV—IV line of FIG. 6, in behalf of the part related the node contact hole, a main part of a manufacturing method of the DRAM in the second example of the first embodiment of the present invention is explained.

First, by the same method of the first example of the first embodiment of the present invention, processes up to the forming process of the first insulation film between layers covered a gate electrode 104 are implemented. Next, a bit contact hole 111 is formed, a silicon oxide film 113 and a BPSG film spacer 114b are formed and a first insulation film between layers becomes an insulation film between layers 110b. Moreover, after a bit line 117 and an insulation film between layers 120 are formed, a node contact hole 121 reaching an N type source drain area 106 from the upper surface of the insulation film between layers 120 is formed.

Figure 15A:
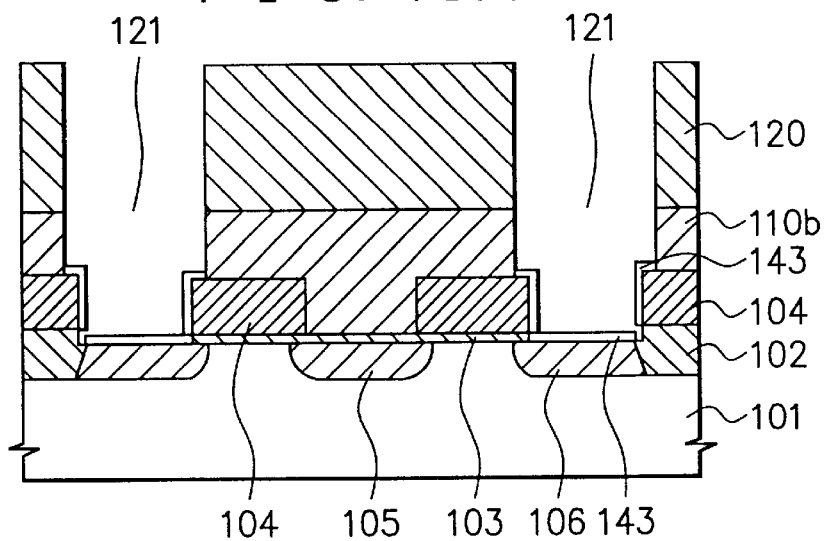
FIG. 15A is a section view showing a manufacturing process at a related part of the node contact hole of DRAM of the second example of the first embodiment of the present invention, corresponding to FIG. 14A.
Figure 15B:
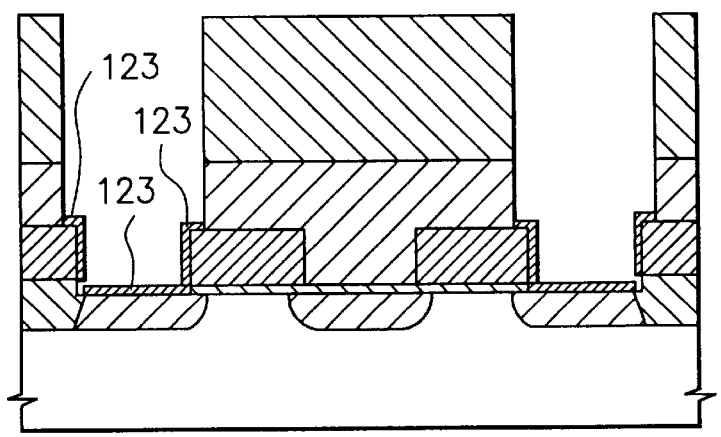
FIG. 15B is a section view showing a manufacturing process at a related part of the node contact hole of DRAM of the second example of the first embodiment of the present invention, corresponding to FIG. 14A.
Figure 16A:
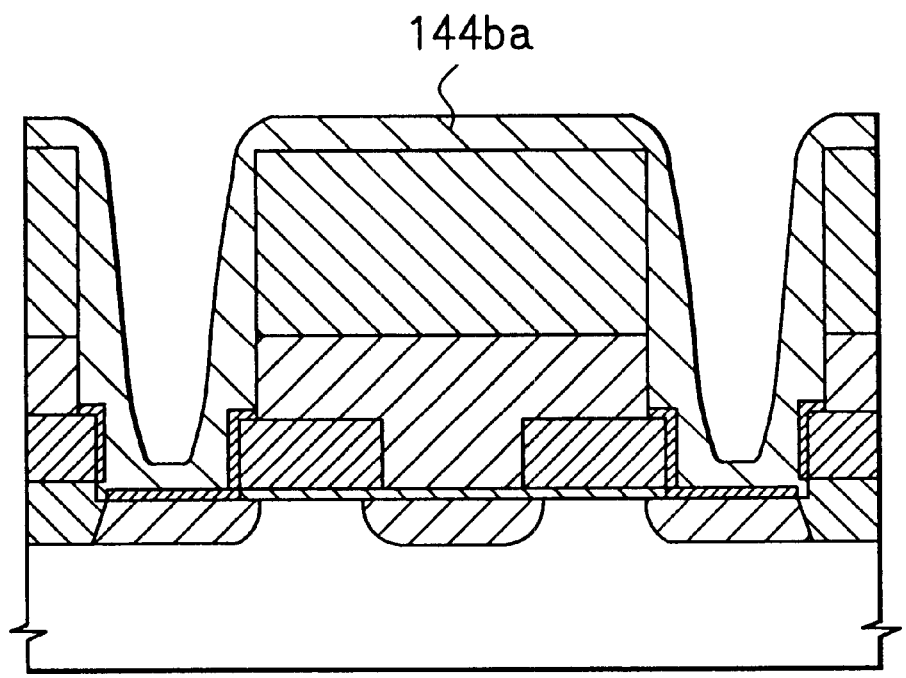
FIG. 16A is a section view showing a manufacturing process at a related part of the node contact hole of DRAM of the second example of the first embodiment of the present invention, corresponding to FIG. 14A.
Figure 17A:
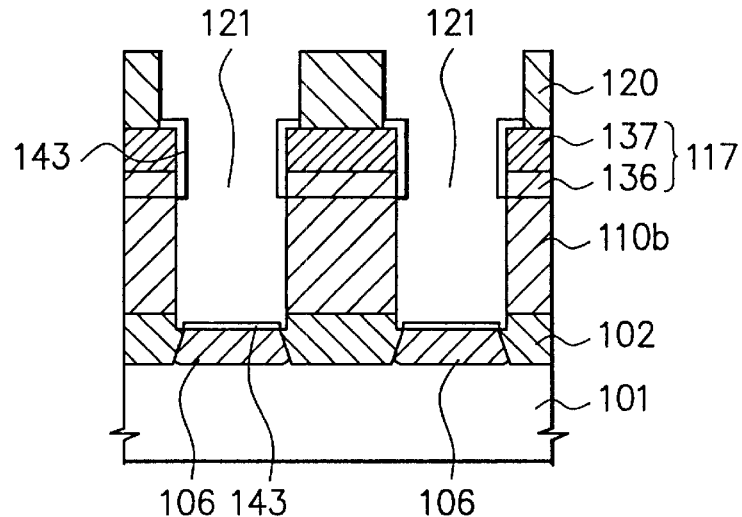
FIG. 17A is a section view showing a manufacturing process at a related part of the node contact hole of DRAM of the second example of the first embodiment of the present invention, corresponding to FIG. 14B.
Figure 17B:
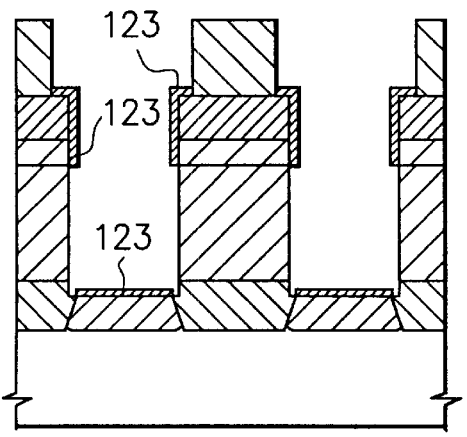
FIG. 17B is a section view showing a manufacturing process at a related part of the node contact hole of DRAM of the second example of the first embodiment of the present invention, corresponding to FIG. 14B.

Next, using $SiH_4$ as a gas material at about $10^{-8}$ Pa ultra high vacuum and at about 800° C. or disilane $Si_2H_6$ as a gas material at about $10^{-8}$ Pa ultra high vacuum and at about 600° C., a silicon film 143 with about 5 nm to 10 nm on the exposed surfaces of the bit line 117 by the node contact hole 121, the gate electrode 104 and the N type source drain area 106 is formed selectively (FIGS. 15A and 16A). By a high speed heat treatment for one to two minutes in $O_2$ ambience at 1100° C., that is a high speed heat oxidation called RTO, the silicon film 143 is oxidized by heat and a silicon oxide film 123 with about 10 nm to 20 nm thickness is formed (FIGS. 15B and 17B). A forming method of a silicon oxide film 113 in the second example of the first embodiment of the present invention is the same as the silicon oxide film 123.

Figure 15C:
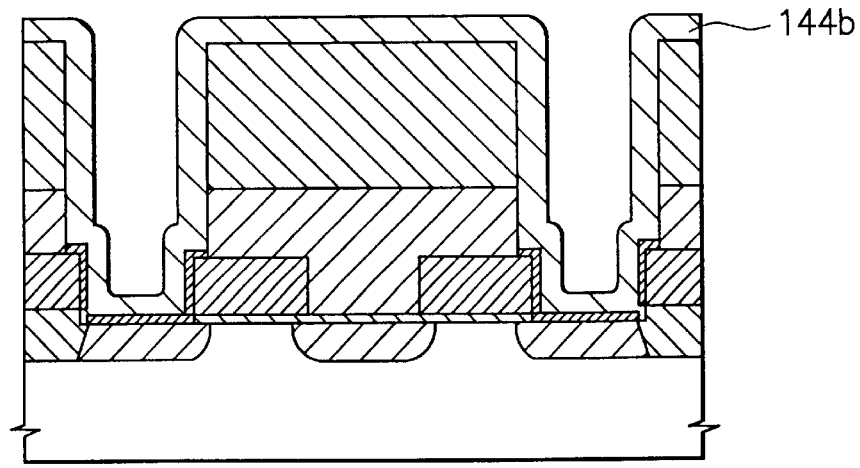
FIG. 15C is a section view showing a manufacturing process at a related part of the node contact hole of DRAM of the second example of the first embodiment of the present invention, corresponding to FIG. 14A.
Figure 17C:
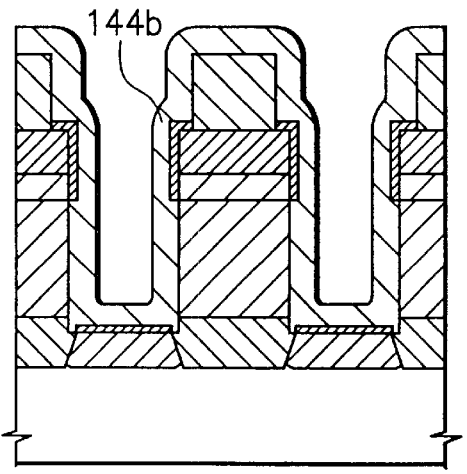
FIG. 17C is a section view showing a manufacturing process at a related part of the node contact hole of DRAM of the second example of the first embodiment of the present invention, corresponding to FIG. 14B.
Figure 18A:
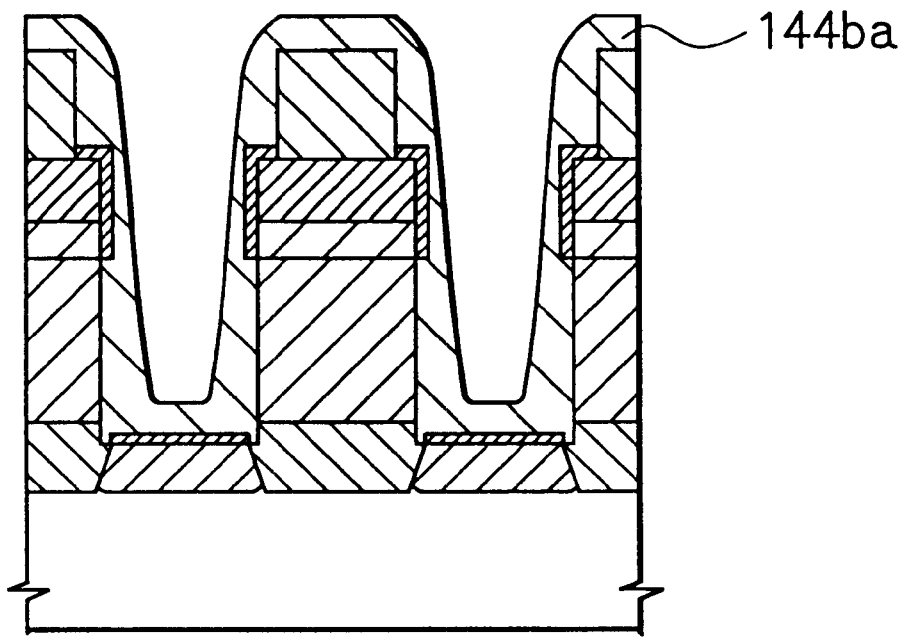
FIG. 18A is a section view showing a manufacturing process at a related part of the node contact hole of DRAM of the second example of the first embodiment of the present invention, corresponding to FIG. 14B.
Figure 18B:
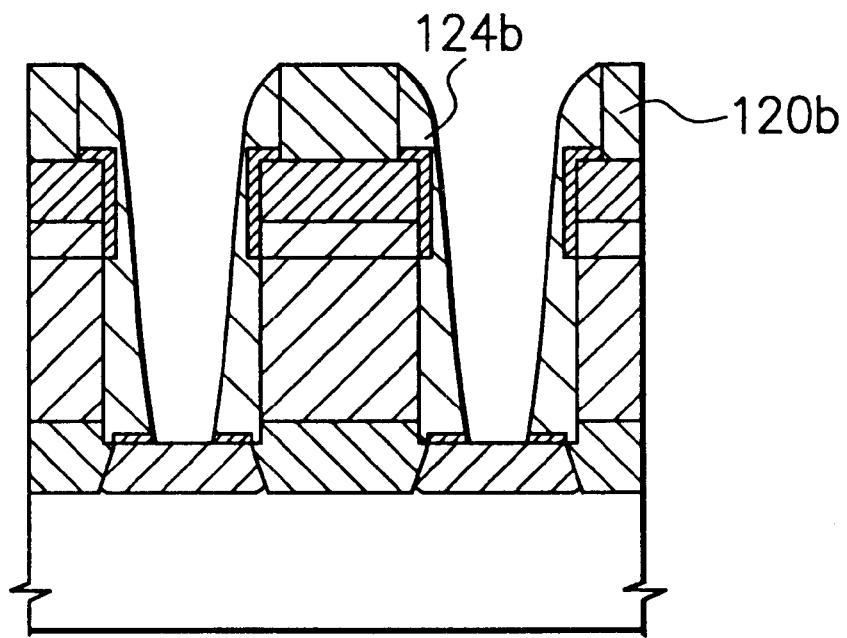
FIG. 18B is a section view showing a manufacturing process at a related part of the node contact hole of DRAM of the second example of the first embodiment of the present invention, corresponding to FIG. 14B.

Next, by LPCVD a BPSG film 144b with about 100 nm thickness is formed on the whole surface. A concentration of phosphorus and boron of the BPSG film 144b is for example about 1.8 mol % and 3.9 mol % (FIGS. 15C and 17C). By heat treatment for about thirty minutes at about 800° C., the BPSG film 144b is reflowed and a BPSG film 144ba is formed (FIGS. 16A and 18A).

Figure 16B:
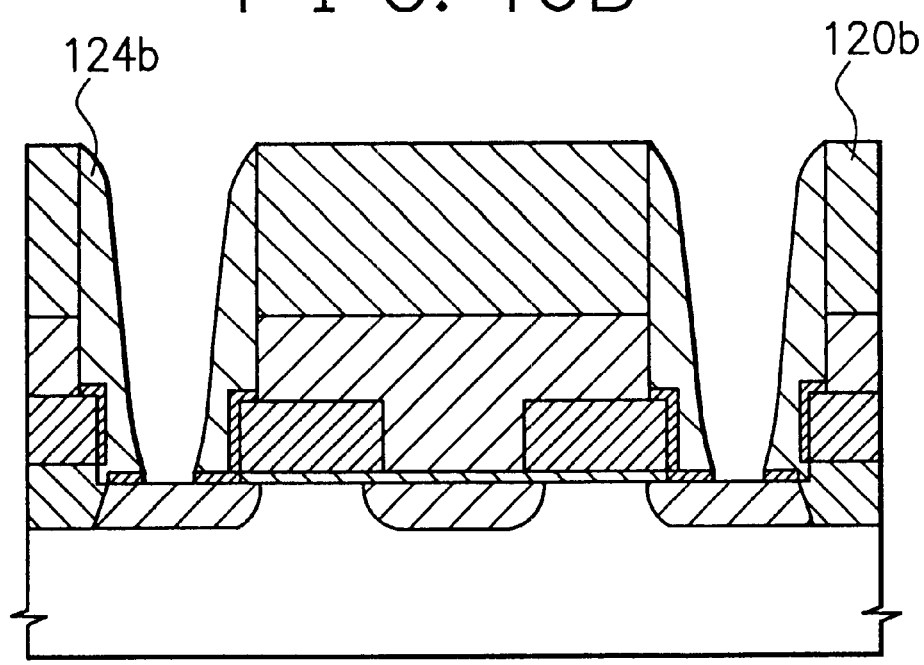
FIG. 16B is a section view showing a manufacturing process at a related part of the node contact hole of DRAM of the second example of the first embodiment of the present invention, corresponding to FIG. 14A.

After the above process, the BPSG film 144ba is etch backed by an anisotropic etching, a BPSG film spacer 124b is formed. At the time of this etch back, the silicon oxide film 123 formed on the surface of the N type source drain area 106 is also etched and the silicon oxide film 123 of this part remains only right under the BPSG film spacer 124b in self matching for the BPSG film spacer 124b. And the insulation film between layers 120 turns to an insulation film between layers 120b with about 350 nm thickness. On the bottom face of the node contact hole 121, the N type source drain area 106 not covered and exposed by the silicon oxide film 123 and the BPSG film spacer 124b is about 200 nm×180 nm to about 200 nm×190 nm. At the bit line 117 exposed by the node contact hole 121 and the near part of the step part by the gate electrode 104, the thickness of the BPSG film spacer 124b are about 20 nm to 40 nm and about 30 nm to 50 nm respectively (FIGS. 14A, 14B and 16B).

Then, by the same method of the first example of the first embodiment of the present invention, an N type amorphous or polycrystal silicon film with about 700 nm thickness is formed on the whole surface. This silicon film is patterned, before and after this, heat treatment is applied and a storage node electrode 127 made of an N type polycrystal silicon film is formed. The storage node electrode 127 connects to the N type source drain area 106 via the node contact hole 121 (FIGS. 14A and 14B). After this, a capacity insulation film is formed on the whole surface and a cell plate electrode is formed.

The second example of the first embodiment of the present invention has the effect of the first example of the first embodiment of the present invention. At the second example of the first embodiment of the present invention, instead of using a silicon oxide film spacer, on the exposed surface by the self align contact hole at the middle and lower wiring layers, a thin silicon oxide film is formed selectively, an opened area not covered by the BPSG film spacer at the lower wiring layer is larger than that of the first example of the first embodiment of the present invention. Therefore, at the second example of the first embodiment of the present invention compared with the first example of the first embodiment of the present invention, it is easy to make a contact resistance between the upper wiring layer and the lower wiring layer at the self align contact hole lower.

At the second example of the first embodiment of the present invention, the COB structure DRAM having the bit contact hole and the node contact hole made of the self align contact holes is explained as an example, however the second example of the first embodiment of the present invention is applicable for the self align contact hole at the general multilayer wiring structure. At the second example of the first embodiment of the present invention, the BPSG film spacer is explained as an example, the second example of the first embodiment of the present invention is not limited to this and it is possible to adopt a PSG film spacer instead of a BPSG film spacer. Moreover, the second example of the first embodiment of the present invention are not limited to the various numeral values stated above.

A characteristic of the second embodiment of the present invention is that a polycrystal silicon film spacer is provided on the surface of the insulation film spacer made of the reflowed BPSG film spacer or the reflowed PSG film spacer set on the side of the self align contact hole. As an explanation of the second embodiment, a COB structure DRAM in which the bit contact hole and the node contact hole are made of the self align contact holes is used as an example, an application of the second embodiment is not limited to the bit contact hole and the node contact hole of a DRAM and it is applicable to general multilayer wiring structure.

Figure 19:
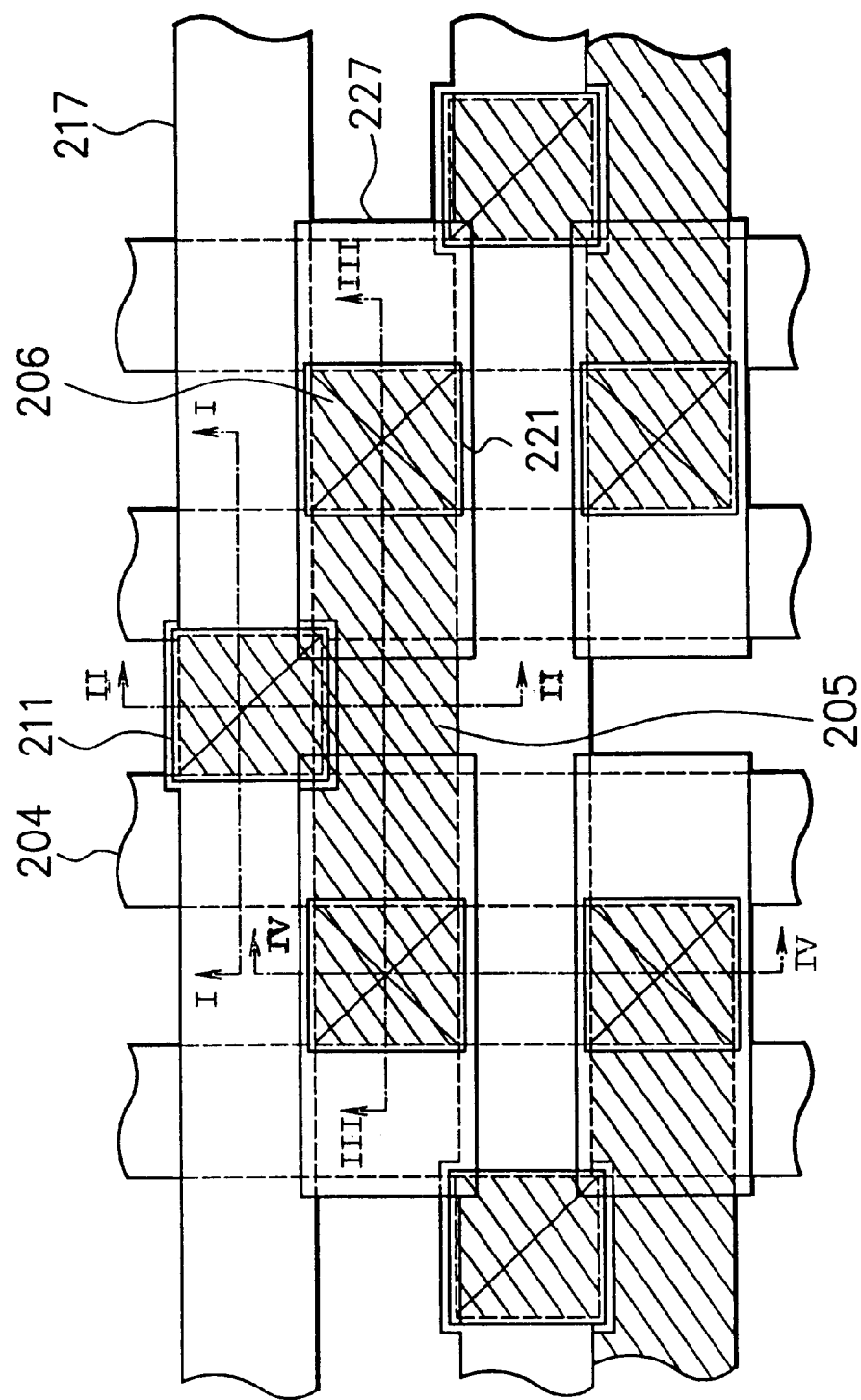
FIG. 19 is a plan view of a first example of the second embodiment of the present invention.
Figure 20A:
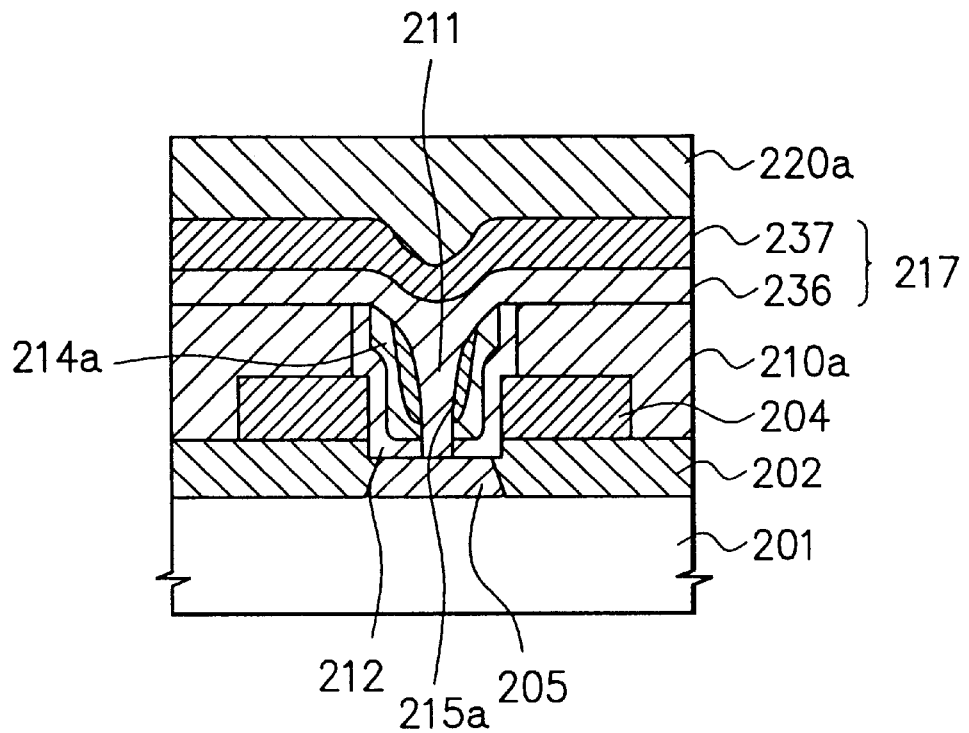
FIG. 20A is a section view of the first example of the second embodiment of the present invention at the I—I line of FIG. 19.
Figure 20B:
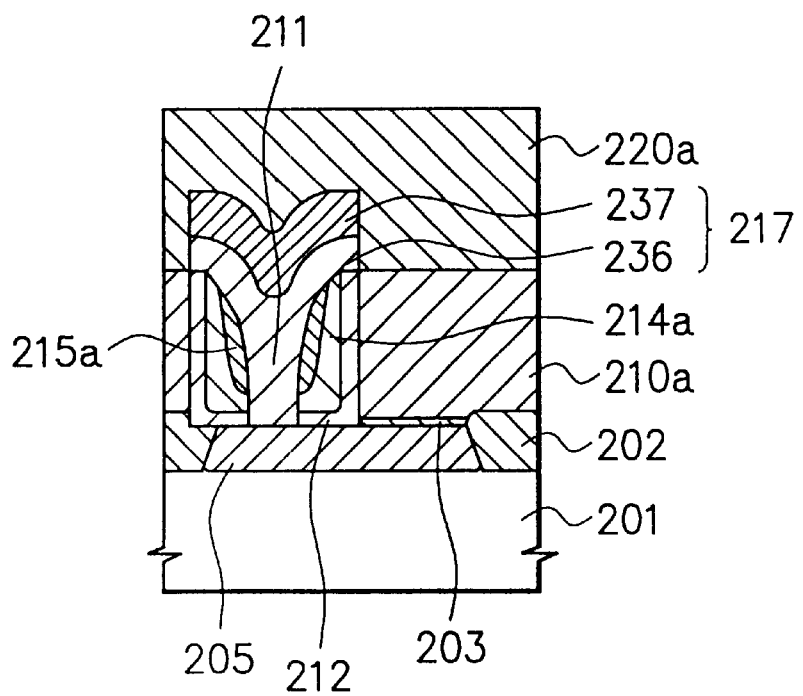
FIG. 20B is a section view of the first example of the second embodiment of the present invention at the II—II line of FIG. 19.
Figure 21A:
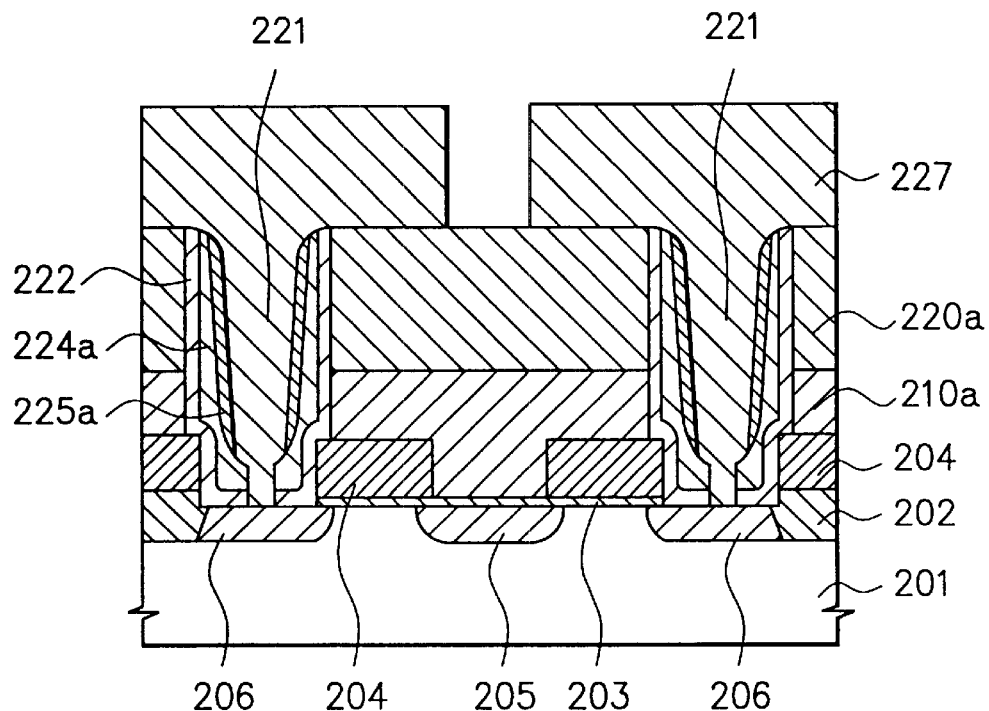
FIG. 21A is a section view of the first example of the second embodiment of the present invention at the III—III line of FIG. 19.

Referring to FIG. 19 showing a plan view of a COB structure DRAM, FIGS. 20A and 20B showing section views at the I—I line and II—II line of FIG. 19 and FIGS. 21A and 211B showing section views at the III—III line and IV—IV line of FIG. 19, at the DRAM having the self align contact hole of a first example of the second embodiment of the present invention, the minimum processing measure is formed in 0.3 μm and a wiring pitch is 0.8 μm and structure is mentioned below. An element forming area is hatched in FIG. 19 and showing of the capacity insulation film and the cell plate electrode constituting of capacitor is omitted in FIGS. 19, 20A, 20B, 21A and 21B.

On the surface of the element forming area and the element separation area of a P type silicon substrate 201, a gate oxide film 203 with about 10 nm thickness and for example a LOCOS type field oxide film 202 with about 300 nm thickness are provided. On the surface of the field oxide film 202 and the gate oxide film 203, a gate electrode 204 is provided. A line width and an interval of this gate electrode 204 are for example about 0.4 μm respectively and the gate electrode 204 is constituted of a tungsten polycide film laminated a tungsten silicide film with about 150 nm thickness to an N type polycrystal silicon film with about 100 nm. On the surface of the element forming area of the P type silicon substrate 201, N type source drain areas 205 and 206 are provided in self matching for the gate electrode 204 and the field oxide film 202. The minimum line width and the minimum interval of the N type source drain areas 205 and 206 are 0.4 μm respectively.

The surface of the P type silicon substrate 201 including the gate electrode 204, the field oxide film 202 and the gate oxide film 203 is covered with an insulation film between layers 210a made of a kind of silicon oxide insulation film. The upper surface of the insulation film between layers 210a is flattened and the thickness of the insulation film between layers 210a from the surface of the P type silicon substrate 201 is about 500 nm. The upper surface of the insulation film between layers 210a and the bottom face of the insulation film between layers 210a covering directly the gate electrode 204 are at least constituted of the silicon oxide films.

At the insulation film between layers 210a, a bit contact hole 211 reaching to the N type source drain area 205 penetrating the insulation film between layers 210a and the gate oxide film 203 from this insulation film between layers 210a is provided. The bit contact hole 211 is formed in self matching for the gate electrode 204 and penetrates the insulation film between layers 210a of the vacant part of the gate electrode 204. A bore at the upper end of the bit contact hole 211 is about 0.5 μm, however a minimum bore of the bit contact hole 211 at the lower place than the upper surface of the gate electrode 204 is the same length as an interval of the gate electrode 204 and is about 0.4 μm. By the bit contact hole 211, the upper surface and a part of the side of the gate electrode 204 are exposed.

The side of the bit contact hole 211 is covered directly with a silicon oxide film spacer 212 with about 30 nm thickness. Moreover, the surface of the silicon oxide film spacer 212 is covered with a BPSG film spacer 214a reflowed by heat treatment. The concentration of phosphorus and boron of the BPSG film constituting of the BPSG film spacer 214a is for example about 2.5 mol % and about 4.3 mol %. A maximum thickness of the BPSG film spacer 214a is about 70 nm and the thickness of the BPSG film spacer 114a at the near part of the step part by the gate electrode 204 exposed by the bit contact hole 211 is about 35 nm to 40 nm. The surface of the BPSG film 214a exposed in the bit contact hole 211 is covered with a polycrystal silicon film spacer 215a. A maximum thickness of the polycrystal silicon film spacer 215a is about 30 nm to 35 nm. The upper end of the polycrystal silicon film spacer 215a is at the 70 nm to 100 nm lower place than the upper end of the bit contact hole 211 that is the upper surface of the insulation film between layers 210a and the lower end of the polycrystal silicon film spacer 215a is at the 100 nm to 150 nm higher place than the bottom face of the bit contact hole 211 that is the surface of the N type source drain area 205. At the surface of the N type source drain area 205 being the part of the bottom face of the bit contact hole 211, the silicon film spacer 212 and the BPSG film spacer 214a are opened in self matching for the polycrystal silicon film spacer 215a. The minimum width of this opened part is about 0.2 μm (FIGS. 20A and 20B).

On the surface of the insulation film between layers 210a, a bit line 217 connecting to the N type source drain area 205 via the bit contact hole 211 is provided. The bit line 217 is constituted of a tungsten polycide film laminated a tungsten silicide film 237 with about 150 nm thickness to an N type polycrystal silicon film 236 with about 100 nm thickness, as the same as the gate electrode 204. A wiring pitch of the bit line 217 is about 0.8 μm, a line width and an interval of the bit line 217 at the part of the bit contact hole 211 are about 0.5 μm and about 0.3 μm respectively, a line width and an interval of the bit line 217 at the part excluded the bit contact hole 211 are about 0.4 μm respectively. The surface of the insulation film between layers 210a including the bit line 217 is covered with the insulation film between layers 220a made of a kind of silicon oxide insulation film. The upper surface of the insulation film between layers 220a is also flattened and the film thickness of the of the insulation film between layers 220a from the surface of the insulation film between layers 210a is about 350 nm. The upper surface of the insulation film between layers 220a and the bottom face of the insulation film between layers 220a covering directly the bit line 217 are at least formed by a silicon oxide film (FIGS. 19, 20A and 20B).

At the insulation film between layers 220a, a node contact hole 221 reaching an N type source drain area 206 penetrating the insulation film between layers 220a, 210a and the gate oxide film 203 from the surface of the insulation film between layers 220a is provided. The node contact hole 221 is formed in self matching for the bit line 217 and penetrates the insulation film between layers 220a of the vacant part of the bit line 217, moreover is formed in self matching for the gate electrode 204 and penetrates the insulation film between layers 210a of the vacant part of the gate electrode 204. A bore of the upper end of the node contact hole 221 is about 0.5 μm, a minimum bore of the node contact hole 221 from the upper surface of the bit line 217 to the upper surface of the gate electrode 204 is about 0.4 μm and a bore of the node contact hole 221 at the lower place than the upper surface of the gate electrode 204 is about 0.4 μm. By these node contact holes 221, the upper surface and a part of the side of the bit line 217 and the upper surface and a part of the side of the gate electrode 204 are exposed.

The side of the node contact hole 221 is covered directly with a silicon oxide film spacer 222 with about 30 nm thickness and the surface of the silicon oxide film spacer 222 is covered with a BPSG film spacer 224a. The maximum thickness of the BPSG film spacer 224a is about 100 nm. The thicknesses of the gate electrode 204 exposed by the node contact hole 221 and the BPSG film spacer 214a at the near part of the step part by the bit line 217 are about 35 nm to 40 nm and about 45 nm to 50 nm respectively. The surface of the BPSG film spacer 224a exposed in the node contact hole 221 is covered with a polycrystal silicon film spacer 225a. The maximum thickness of the polycrystal silicon film spacer 225a is about 35 nm to 40 nm. The upper end of the polycrystal silicon film spacer 225a is at about 100 nm to 150 nm lower place than the upper end of the node contact hole 221 that is the upper surface of the insulation film between layers 220a and the lower end of the polycrystal silicon film spacer 225a is at about 100 nm to 150 nm higher place than the bottom face of the node contact hole 221 that is the surface of the N type source drain area 206. On the surface of the N type source drain area 206 at the part of the bottom face of the node contact hole 211, the silicon oxide film spacer 222 and the BPSG film spacer 224a are opened in self matching for the polycrystal silicon film spacer 225a. This open part is a square with about 0.2 μm one side length.

Figure 21B:
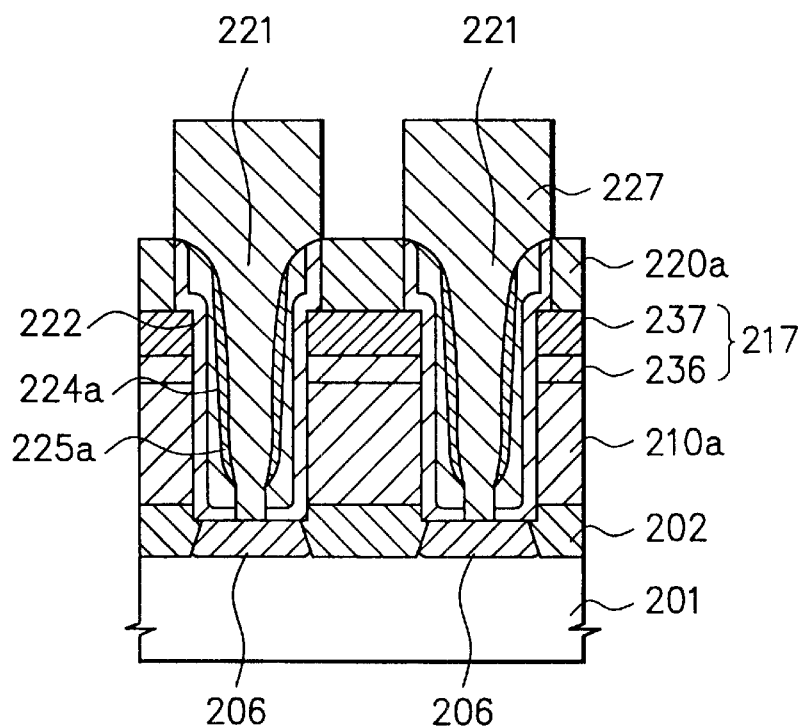
FIG. 21B is a section view of the first example of the second embodiment of the present invention at the IV—IV line of FIG. 19.

On the surface of the insulation film between layers 220a, a storage node electrode 227 connecting to the N type source drain area 206 via the node contact hole 221 is provided. The storage node electrode 227 is constituted of an N type polycrystal silicon film with about 700 nm thickness on the upper surface of the insulation film between layers 220a. The long length direction of the storage node electrode 227 is parallel to the bit line 217, the length, width and interval of the storage node electrode 227 are about 1.3 μm, 0.5 μm and 0.3 μm respectively and the pitches of the storage node electrode 227 at the parallel direction with the bit line 217 and the gate electrode 204 are about 1.6 μm and 0.8 μm respectively. This is not shown in drawings, however on the exposed surface of the storage node electrode 227 and the insulation film between layers 220a, a capacity insulation film is provided and on the surface of the capacity insulation film a cell plate electrode is provided (FIGS. 19, 21A and 21B).

Referring to FIGS. 19 to 21B, FIGS. 22A, 22B, 22C, 23A and 23B showing section views of the manufacturing process at the III—III line of FIG. 19 and FIGS. 24A, 24B, 24C, 25A and 25B showing section views of the manufacturing process at the IV—IV line of FIG. 19, a main part of the manufacturing method of the first example of the second embodiment is explained, as showing a related part of the node contact hole.

By the same method of the first example of the first embodiment of the present invention, a bit contact hole 211 is formed and a silicon oxide film with about 30 nm thickness constituting a silicon oxide film spacer 212 is formed and a BPSG film with about 70 nm thickness constituting a BPSG film spacer 114a is formed and this BPSG film is treated by heat at 850° C. for about ten minutes in $N_2$ ambience and reflowed. After this, a polycrystal silicon film with about 50 nm thickness constituting a polycrystal silicon film spacer 215a is formed on the whole surface and the polycrystal silicon film spacer 215a is formed by an etch back of an anisotropic etching for a silicon film. By the etch back of the anisotropic etching for the silicon film, the BPSG film spacer 214a and a silicon oxide film spacer 214 are formed and the insulation film between layers 210a is also completed. Next, an insulation film between layers 220 with about 370 nm thickness covering the whole surface is formed.

Figure 24A:
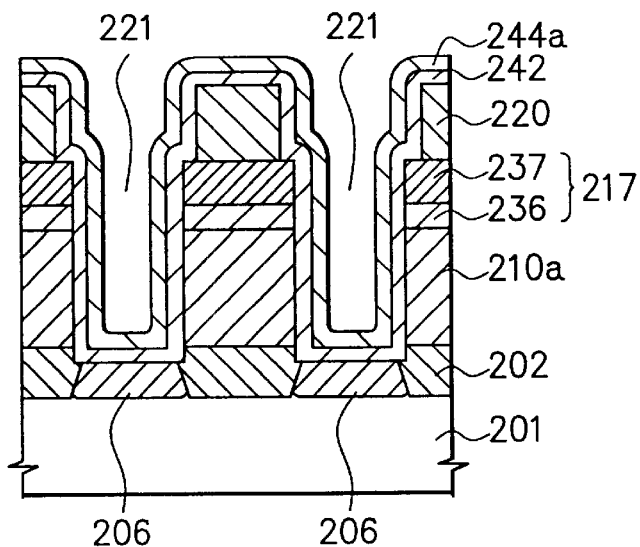
FIG. 24A is a section view showing a manufacturing process of the first example of the second embodiment of the present invention at the IV—IV line of FIG. 19.
Figure 24B:
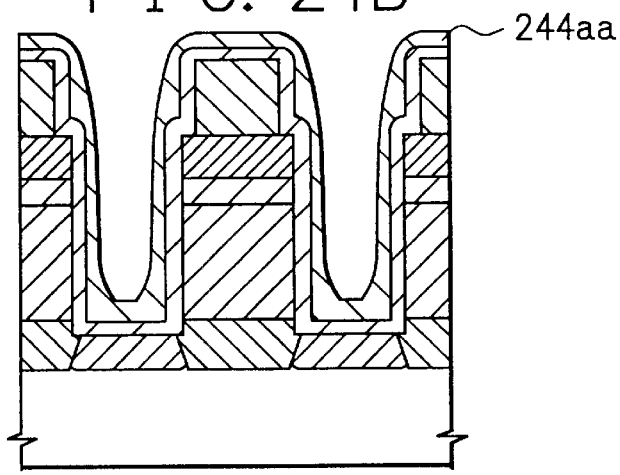
FIG. 24B is a section view showing a manufacturing process of the first example of the second embodiment of the present invention at the IV—IV line of FIG. 19.

Next, by an anisotropic etching, the insulation film between layers 220, 210a and a gate oxide film 203 are etched in order, a node contact hole 221 reaching an N type source drain area 206 from the upper surface of the insulation film between layers 220 is formed. By LPCVD, a silicon oxide film 242 with about 30 nm thickness and a BPSG film 244a with about 70 nm thickness are formed in order on the whole surface. The concentration of phosphorus and boron of the BPSG film 244a are set at for example about 1.8 mol % and 3.9 mol % (FIGS. 22A and 24A). Then, for example heat treatment at about 800° C. for about thirty minutes in $N_2$ ambience is implemented and the BPSG film 244a is reflowed and turns to a BPSG film 244aa. At this process, the thickness of a gate electrode 204 exposed by the node contact hole 221 and the BPSG film 244aa at the near part of the step part by a bit line 217 are about 35 nm to 40 nm and about 45 nm to 50 nm respectively (FIGS. 22B and 24B).

Figure 23A:
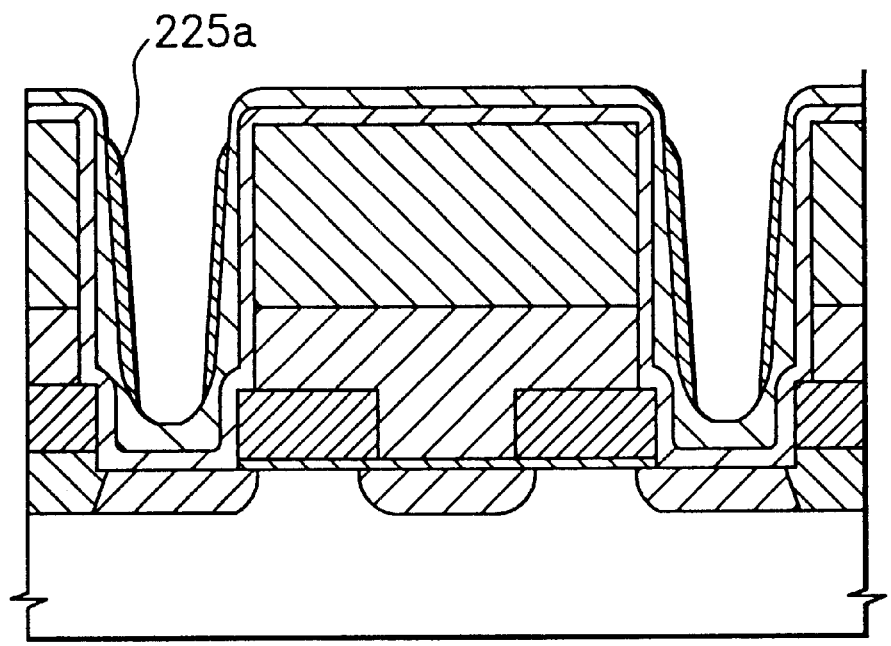
FIG. 23A is a section view showing a manufacturing process of the first example of the second embodiment of the present invention at the III—III line of FIG. 19.
Figure 23B:
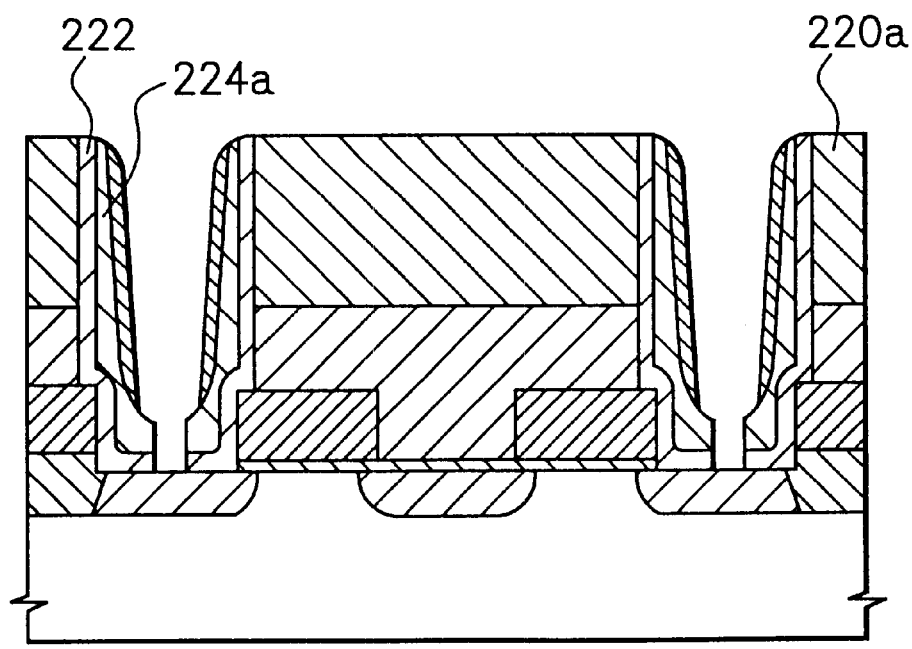
FIG. 23B is a section view showing a manufacturing process of the first example of the second embodiment of the present invention at the III—III line of FIG. 19.
Figure 24C:
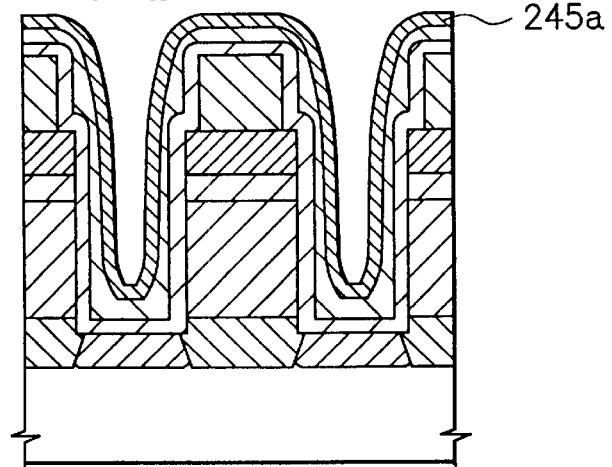
FIG. 24C is a section view showing a manufacturing process of the first example of the second embodiment of the present invention at the IV—IV line of FIG. 19.
Figure 25A:
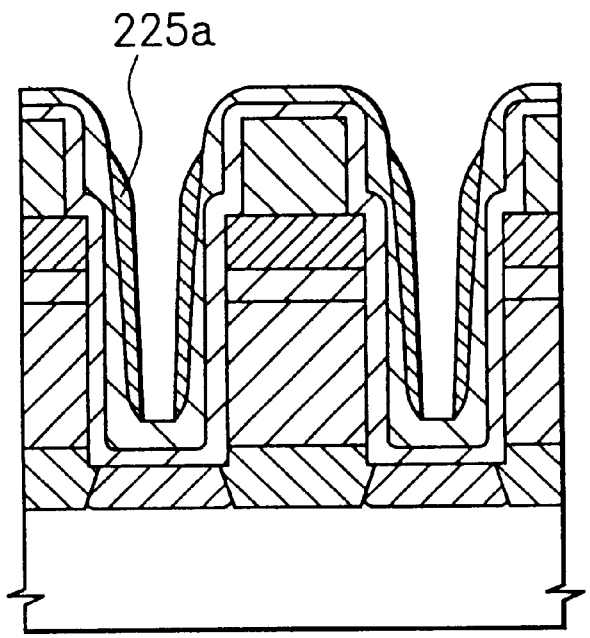
FIG. 25A is a section view showing a manufacturing process of the first example of the second embodiment of the present invention at the IV—IV line of FIG. 19.
Figure 25B:
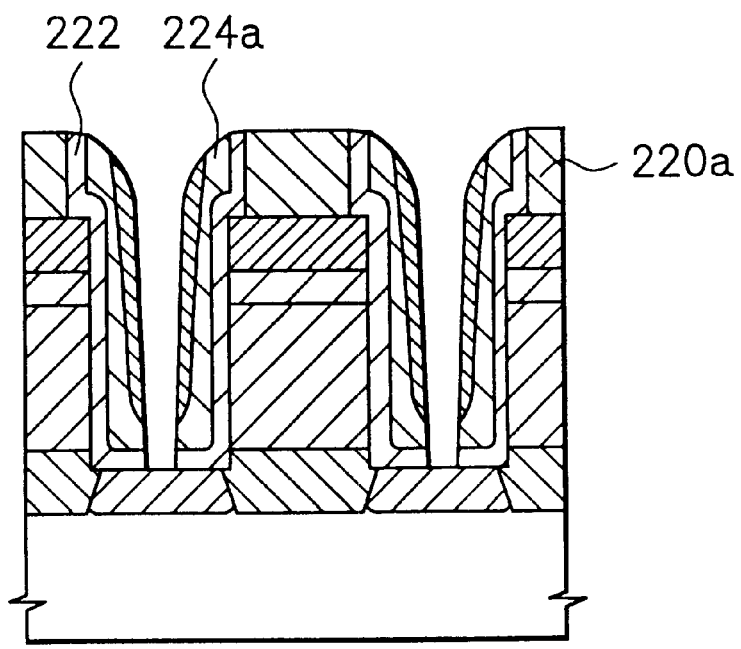
FIG. 25B is a section view showing a manufacturing process of the first example of the second embodiment of the present invention at the IV—IV line of FIG. 19.

After this, by LPCVD a polycrystal silicon film 245a with about 50 nm thickness is formed on the whole surface (FIGS. 22C and 24C). And the polycrystal silicon film 245a is fully etch backed by an anisotropic etching and a polycrystal silicon film spacer 225a covering the surface of the BPSG film 244aa in the node contact hole 221 is formed. This anisotropic etching is implemented by using mixed gas of 40 sccm hydrogen bromide HBr and 100 sccm chlorine $Cl_2$ at for example 8 Pa of degree of vacuum, 450 W power. By the full etch back of the time of forming the polycrystal silicon film spacer 225a, the upper end of the polycrystal silicon film spacer 225a is placed about 300 nm to 350 nm lower than the upper surface of the insulation film between layers 220. The maximum thickness of the polycrystal silicon film spacer 225a is thinner than the thickness of the polycrystal silicon film spacer 245a and is about 35 nm to 40 nm. The reason why the maximum thickness of about 30 nm to 35 nm of the polycrystal silicon film spacer 215a is thinner than that of the polycrystal silicon film spacer 225a is that the slant of the polycrystal silicon film becoming the polycrystal silicon film spacer 215a in the bit contact hole 211 is more gentle than that of the polycrystal silicon film 244a in the node contact hole 221 (FIGS. 23A and 25A).

The etch back for the silicon oxide film used the polycrystal silicon film spacer 225a as a mask is implemented, this process is the same in the first example of the first embodiment of the present invention and a silicon oxide film spacer 222 and a BPSG film spacer 224a are formed (FIGS. 19, 21A, 21B, 23B and 25B). After this, a storage node electrode 227 is formed and a capacity insulation film and a cell plate electrode are formed (FIGS. 19, 21A and 21B).

The first example of the second embodiment of the present invention has the same effect of the first example of the first embodiment of the present invention. In the first example of the second embodiment of the present invention, the polycrystal silicon film spacer 225a is used as a mask for this etch back, at the part covered with the polycrystal silicon film spacer 225a, differing from the first embodiment of the present invention, the thickness of the BPSG film spacer 224a is the same as the BPSG film spacer 244a. Therefore, in the first example of the second embodiment of the present invention, setting of the film thickness of the BPSG film 224a etc. is possible to be thinner than the first and second examples of the first embodiment of the present invention. At the first example of the second embodiment, by a different means from the second example of the first embodiment of the present invention, a contact resistance is decreased from the first example of the first embodiment of the present invention.

At the first example of the second embodiment of the present invention, the COB structure DRAM having the bit contact hole and the node contact hole made of the self align contact holes is explained as an example, however the first example of the second embodiment of the present invention is also applicable to a self align contact hole at general multilayer wiring structure. And at the first example of the second embodiment of the present invention, the BPSG film spacer is explained as an example, the first example of the second embodiment is not limited to this, instead of the BPSG film spacer, the PSG film is adoptable. Moreover the first example of the second embodiment of the present invention is not limited to the above mentioned various numeral values.

In the first example of the second embodiment of the present invention, on the sides of the bit contact hole and the node contact hole made of the self align contact holes, the silicon oxide film spacer, the BPSG film spacer for example reflowed and the laminated insulation film spacer and the polycrystal silicon film spacer covering these insulation films are provided, however the second embodiment is not limited to this.

Figure 26A:
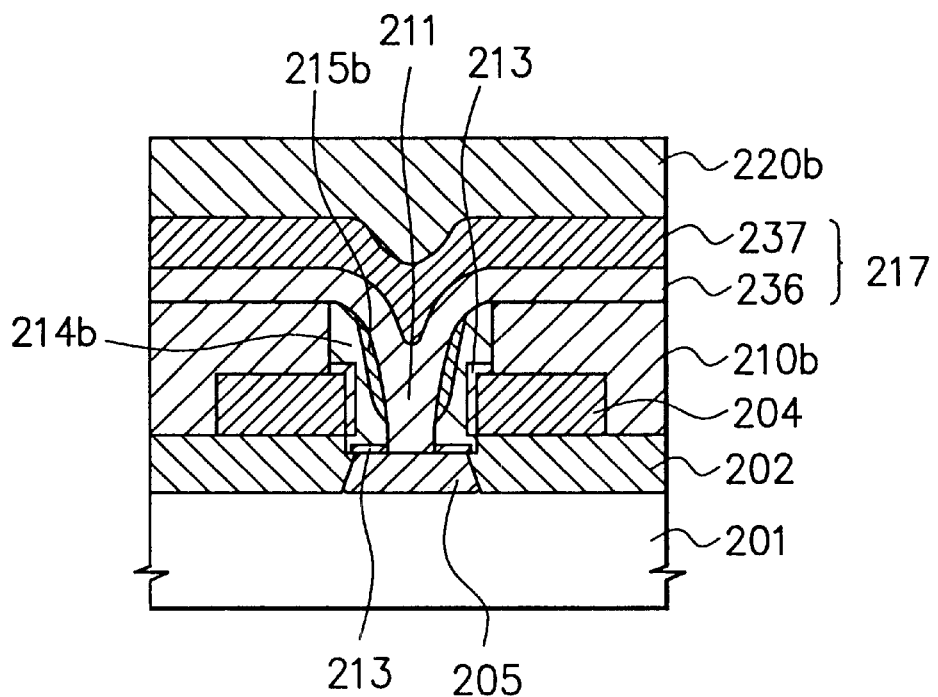
FIG. 26A is a section view showing a related part of a bit contact hole of DRAM of a second example of the second embodiment of the present invention.
Figure 26B:
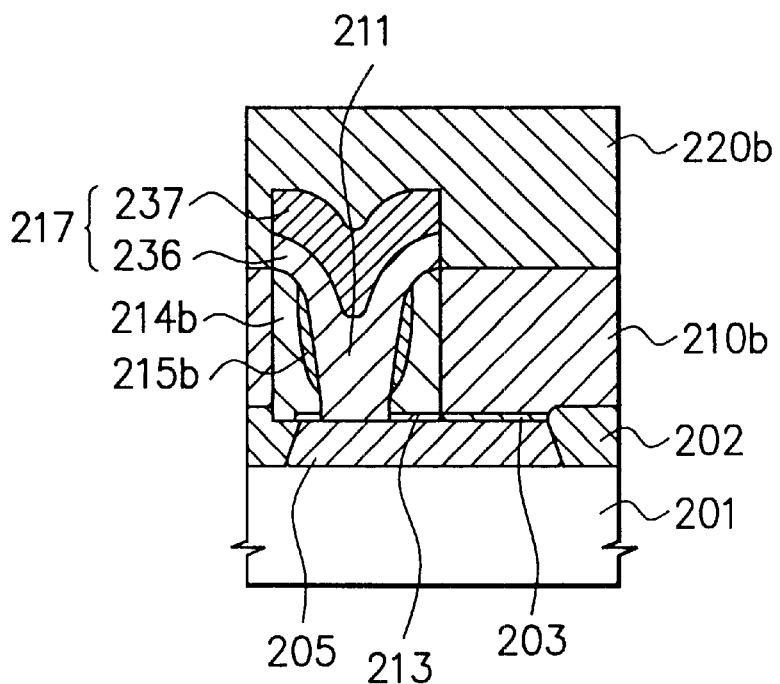
FIG. 26B is a section view showing a related part of a bit contact hole of DRAM of the second example of the second embodiment of the present invention.
Figure 27A:
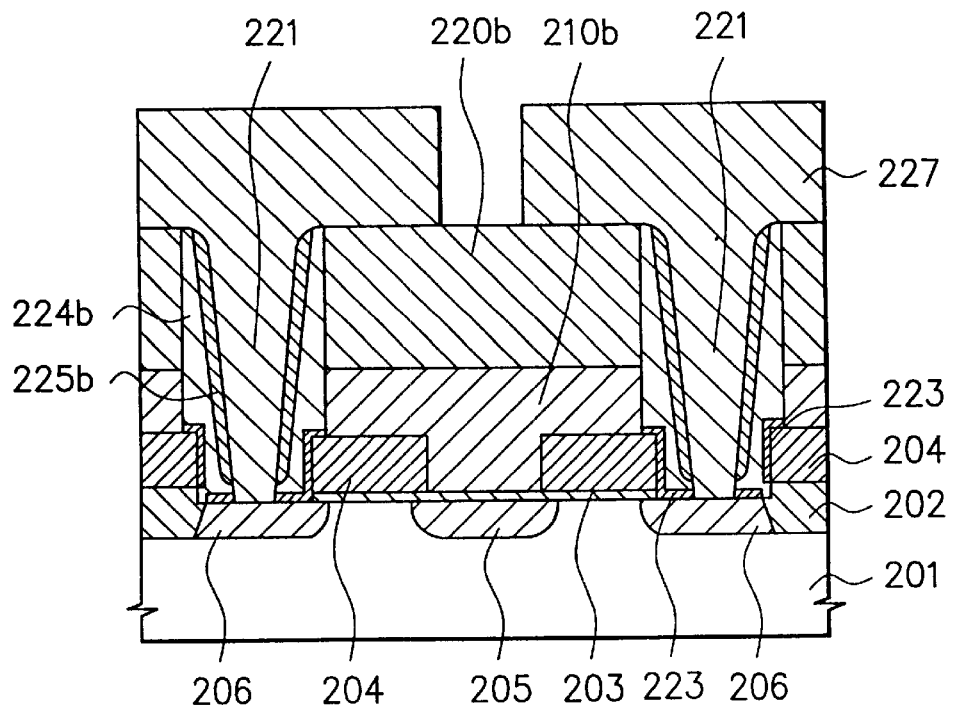
FIG. 27A is a section view showing a related part of a node contact hole of DRAM of the second example of the second embodiment of the present invention.
Figure 27B:
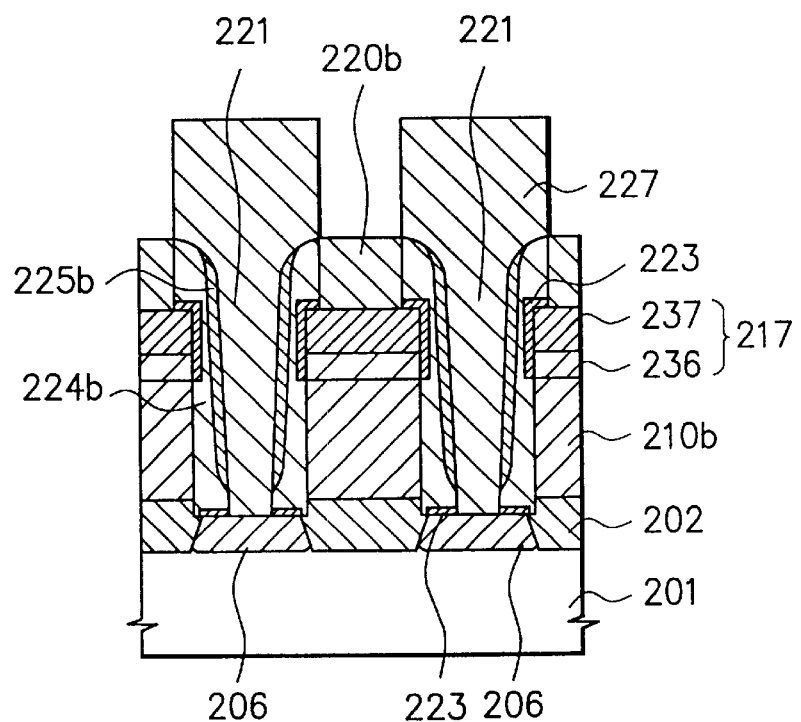
FIG. 27B is a section view showing a related part of a node contact hole of DRAM of the second example of the second embodiment of the present invention.

Referring to FIGS. 26A and 26B showing section views of the part including the bit contact hole of the COB structure DRAM and FIGS. 27A and 27B showing section views of the part including the node contact hole of the DRAM, a second example of the second embodiment of the present invention is explained. The plan view of the second example of the second embodiment of the present invention is the same as FIG. 19 which is the plan view of the first example of the second embodiment of the present invention, therefore the plan view is omitted. FIGS. 26A and 26B are section views at the I—I line and II—II line of FIG. 19, FIGS. 27A and 27B are section views at the III—III line and IV—IV line of FIG. 19.

The difference between the second example and the first example of the second embodiment of the present invention is the same difference between the second example and the first example of the first embodiment of the present invention, the silicon oxide film spacer as the insulation film spacer covering the side of the self align contact hole does not exist and the insulation film is only made of the BPSG film spacer, on the exposed surface of the middle wiring layer and the lower wiring layer formed by the self align contact hole, a silicon oxide film is formed selectively, moreover, said silicon oxide film formed selectively on said exposed surface of the lower wiring layer is opened in self matching for the BPSG film spacer.

At the element forming area and the element separation area on the surface of the P type silicon substrate 201, a gate oxide film 203 with about 10 nm thickness and for example a LOCOS type field oxide film 202 with about 300 nm thickness are provided. A gate electrode 204 on the surface of the field oxide film 202 and the gate oxide film 203 is provided. The line width and the interval of the gate electrode 204 are for example 0.4 µm respectively and the gate electrode 204 is constituted of a tungsten polycide film laminated a tungsten silicide film with about 150 nm thickness to an N type polycrystal silicon film with about 100 nm thickness. On the surface of the P type silicon substrate 201 of the element forming area, an N type source drain area 205 and 206 are provided in self matching for the gate electrode 204 and the field oxide film 202.

The surface of the P type silicon substrate 201 including the gate electrode 204, the field oxide film 202 and the gate oxide film 203 is covered with an insulation film between layers 210b made of a kind of silicon oxide insulation film. The upper surface of the insulation film between layers 210b is flattened and the film thickness of the insulation film between layers 210b from the surface of the P type silicon substrate 201 is about 500 nm. The upper surface of the insulation film between layers 210b and the bottom face of the insulation film between layers 210b covering directly the gate electrode 204 are at least constituted of silicon oxide films.

At the insulation film between layers 210b, a bit contact hole 211 reaching the N type source drain area 205 penetrating the insulation film between layers 210b and the gate oxide film 203 from the surface of this insulation film between layers 210b is provided. The bit contact hole 211 is formed in self matching for the gate electrode 204 and penetrates the insulation film between layers 210b of the vacant part of the gate electrode 204. A bore of the upper end of the bit contact hole 211 is about 0.5 µm, however the minimum bore of the bit contact hole 211 at the lower place than the upper surface of the gate electrode 204 is the same of the interval of the gate electrode 204 and is about 0.4 µm. By this bit contact hole 211, the upper surface and a part of the side of the gate electrode 204 is exposed.

The exposed surface of the gate electrode 204 by the bit contact hole 211 is directly covered with a silicon oxide film 213 by heat oxidation with about 10 nm to 20 nm thickness, moreover a fixed part of the exposed surface of the N type source drain area 205 is also directly covered with the silicon oxide film 213. The side of the bit contact hole 211 is covered with a BPSG film spacer 214b which is an insulation film spacer made of a BPSG film reflowed by heat treatment. The concentration of phosphorus and boron of the BPSG film constituting the BPSG film spacer 214b is about for example 2.5 mol % and 4.3 mol %. The maximum thickness of the BPSG film spacer 214b is about 70 nm and the film thickness of the BPSG film spacer 114b at the near part of the step part by the gate electrode 204 formed by the exposure of the bit contact hole 211 is about 35 nm to 40 nm. The surface of the BPSG film 214b exposed in the bit contact hole 211 is covered with a polycrystal silicon film spacer 215b. The maximum thickness of the polycrystal silicon film spacer 215b is about 30 nm to 35 nm. The upper end of the polycrystal silicon film spacer 215b is placed at about 70 nm to 100 nm lower place than the upper end of the bit contact hole 211 which is the upper surface of the insulation film between layers 210b and the lower end of the polycrystal silicon film spacer 215b is placed at about 100 nm to 150 nm higher place than the bottom face of the bit contact hole 211 which is the surface of the N type source drain area 205. On the surface of the N type source drain area 205 at the part becoming the bottom face of the bit contact hole 211, the silicon oxide film 213 and the BPSG film spacer 214b are opened in self matching for the polycrystal silicon film spacer 215b. The minimum width of this open part is about 150 nm to 160 nm (FIGS. 26A and 26B).

On the surface of the insulation film between layers 210b, a bit line 217 connecting to the N type source drain area 205 via the bit contact hole 211 is provided. The bit line 217 is like as the gate electrode 204, is constituted of a tungsten polycide film laminated a tungsten silicide film 237 with about 150 nm thickness to an N type polycrystal silicon film 236 with about 100 nm thickness. The wiring pitch of the bit line 217 is about 0.8 µm and the line width and the interval of the bit line 217 at the part of the bit contact hole 211 are about 0.5 µm and 0.3 µm respectively and the line width and the interval of the bit line 217 at the part excluded the bit contact hole 211 are about 0.4 µm respectively. The surface of the insulation film between layers 210b including the bit line 217 is covered with an insulation film between layers 220b made of a kind of silicon oxide insulation film. The upper surface of the insulation film between layers 220b is also flattened and the thickness of the insulation film between layers 220b from the surface of the insulation film between layers 210b is about 350 nm. The upper surface of the insulation film between layers 220b and the bottom face of the insulation film between layers 220b covering directly the bit line 217 are at least formed by a silicon oxide film (FIGS. 27A and 27B).

At the insulation film between layers 220b, a node contact hole 221 reaching the N type source drain area 206 penetrating the insulation film between layers 220b, 210b and the gate oxide film 203 from the surface of the insulation film between layers 220b is provided. The node contact hole 221 is formed in self matching for the bit line 217 and penetrates the insulation film between layers 220b of the vacant part of the bit line 217, moreover is formed in self matching for the gate electrode 204 and penetrates the insulation film between layers 210b of the vacant part of the gate electrode 204. The bore of the upper end of the node contact hole 221 is about 0.5 µm and the minimum bore of the node contact hole 221 between the upper surface of the bit line 217 and the upper surface of the gate electrode 204 is about 0.4 µm and the bore of the node contact hole 221 at the lower place than the upper surface of the gate electrode 204 is about 0.4 µm. By this node contact hole 221, the upper surface and a part of the side of the bit line 217 and the upper surface and a part of the side of the gate electrode 204 are exposed.

The exposed surface of the bit line 217 and the gate electrode 204 by the node contact hole 221 is directly covered with a silicon oxide film 223 by heat oxidation with about 10 nm to 20 nm thickness, moreover a fixed part of the exposed surface of the N type source drain area 206 is also directly covered with the silicon oxide film 223. The side of the node contact hole 221 is covered with the BPSG film spacer 124b which is an insulation film spacer made of the BPSG film reflowed by heat treatment. The concentration of phosphorus and boron of the BPSG film constituting the BPSG film spacer 224b is for example about 1.8 mol % and about 3.9 mol %. The maximum thickness of the BPSG film spacer 224b is about 70 nm. The thickness of the BPSG film spacer 214b at the near part of the step part by the gate electrode 204 which is formed by the exposure of the node contact hole 221 and by the bit line 217 is about 35 nm to 40 nm and about 45 nm to 50 nm respectively. The surface of the BPSG film spacer 224b exposed in the node contact hole 221 is covered with a polycrystal silicon film spacer 225b. The maximum thickness of the polycrystal silicon film spacer 225b is about 35 nm to 40 nm. The upper end of the polycrystal silicon film spacer 225b is at about 100 nm to 150 nm lower place than the upper end of the node contact hole 221 that is the upper surface of the insulation film between layers 220b and the lower end of the polycrystal silicon film spacer 225b is at about 100 nm to 150 nm higher place than the bottom face of the node contact hole 221 that is the surface of the N type source drain area 206. At the surface of the N type source drain area 206 at the part of the bottom face of the node contact hole 211, the silicon oxide film 223 and the BPSG film spacer 224b are opened in self matching for the polycrystal silicon film spacer 225b. At the bottom face of the node contact hole 221, the N type source drain area 206 not covered and exposed by the silicon oxide film 223, the BPSG film spacer 224b and the polycrystal silicon film spacer 225b is about 260 nm×250 nm to about 260 nm×240 nm (FIGS. 27A and 27B).

On the surface of the insulation film between layers 220b, a storage node electrode 227 connecting to the N type source drain area 206 via the node contact hole 221 is provided. The storage node electrode 227 is constituted of an N type polycrystal silicon film with about 700 nm thickness at the upper surface of the insulation film between layers 220b. The long length direction of the storage node electrode 227 is parallel to the bit line 217 and the length, width and interval of the storage node electrode 227 are about 1.3 μm, 0.5 μm and 0.3 μm, the pitches of the storage node electrode 227 at the direction of parallel to the bit line 217 and parallel to the gate electrode 204 are about 1.6 μm and about 0.8 μm. On the exposed surface of the storage node electrode 227 and the insulation film between layers 220b a capacity insulation film is provided and on the surface of the capacity insulation film a cell plate electrode is provided, however this drawing is omitted (FIGS. 27A and 27B).

Referring to FIGS. 27A and 27B and FIGS. 28A, 28B and 28C showing section views of the manufacturing process at the part of FIG. 27A and at the III—III line of FIG. 19 and FIGS. 29A, 29B and 29C showing section views of the manufacturing process at the part of FIG. 27B and at the IV—IV line of FIG. 19, using the part of a node contact hole as an example, the main part of the manufacturing method of the DRAM of a second example of the second embodiment of the present invention is explained.

By the same method of the first example of the second embodiment of the present invention, processes up to forming the first insulation film between layers covering the gate electrode 204 etc. are implemented. After this, a bit contact hole 211 is formed and a silicon oxide film 213, a polycrystal silicon film spacer 215b and a BPSG film spacer 214b are formed and the first insulation film between layers becomes an insulation film between layers 210b. Moreover, after a bit line 217 and an insulation film between layers 220 are formed, a node contact hole 221 reaching an N type source drain area 206 from the upper surface of the insulation film between layers 220 is formed.

Next, like the second example of the first embodiment of the present invention, for example using $SiH_4$ as a gas material at about 800° C. in about $10^{-8}$ Pa of an ultra high vacuum, on the surfaces of the bit line 217 by the node contact hole 221, the gate electrode 204 and the N type source drain area 206, a silicon film with about 5 nm to 10 nm thickness is selectively formed. By RTO at about 1100° C. in an $O_2$ ambience for about one to two minutes, said silicon film is oxidized by heat and a silicon oxide film 223 with about 10 nm to 20 nm is formed.

Figure 28A:
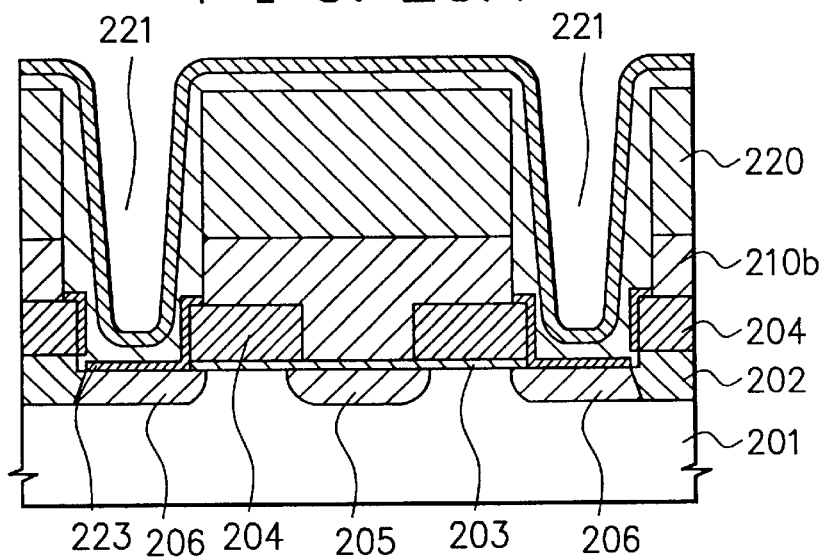
FIG. 28A is a section view showing a manufacturing process of a related part of a node contact hole of DRAM of the second example of the second embodiment of the present invention, corresponding to FIG. 27A.
Figure 29A:
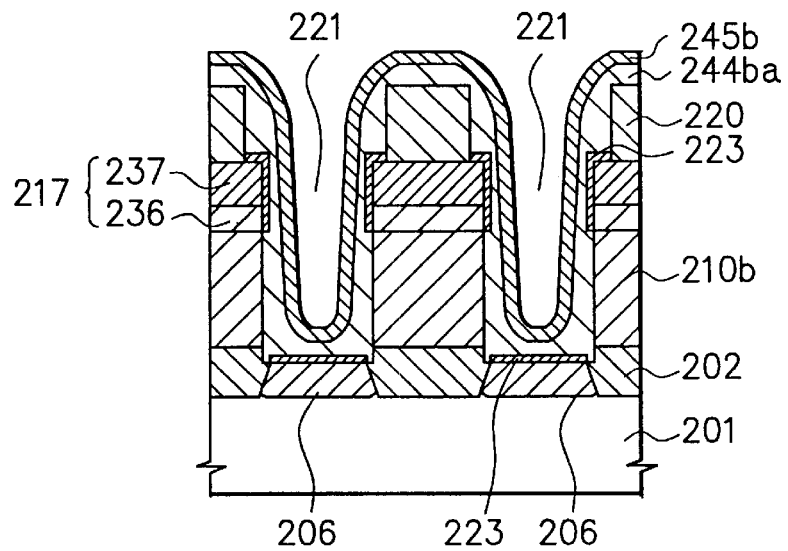
FIG. 29A is a section view showing a manufacturing process of a related part of a node contact hole of DRAM of the second example of the second embodiment of the present invention, corresponding to FIG. 27B.

After this, by LPCVD a BPSG film with about 70 nm thickness is formed. For example, by heat treatment at 800° C. in $N_2$ ambience for about thirty minutes, this BPSG film is reflowed and becomes a BPSG film 244ba. At this process, the thicknesses of the BPSG films 244ba of the gate electrode 204 formed by exposed by the node contact hole 221 and at the near part of the step part by the bit line 217 are about 35 nm to 40 nm and about 45 nm to 50 nm respectively. Then, by LPCVD, a polycrystal silicon film 245b with about 50 nm thickness is formed on the whole surface (FIGS. 28A and 29A).

Figure 28B:
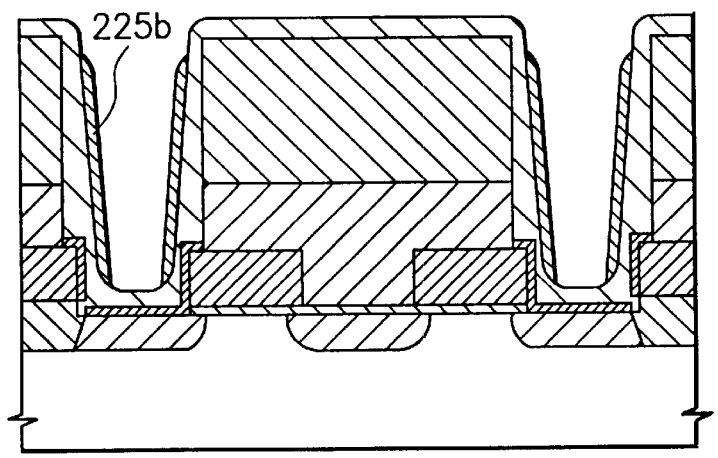
FIG. 28B is a section view showing a manufacturing process of a related part of a node contact hole of DRAM of the second example of the second embodiment of the present invention, corresponding to FIG. 27A.
Figure 28C:
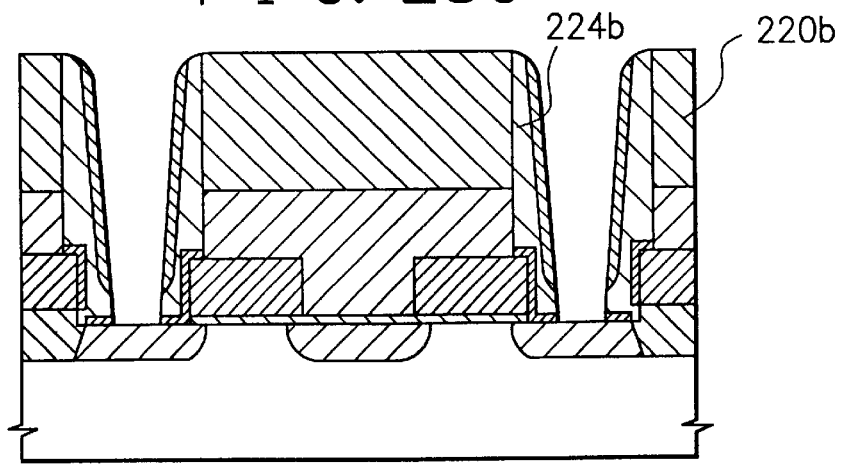
FIG. 28C is a section view showing a manufacturing process of a related part of a node contact hole of DRAM of the second example of the second embodiment of the present invention, corresponding to FIG. 27A.
Figure 29B:
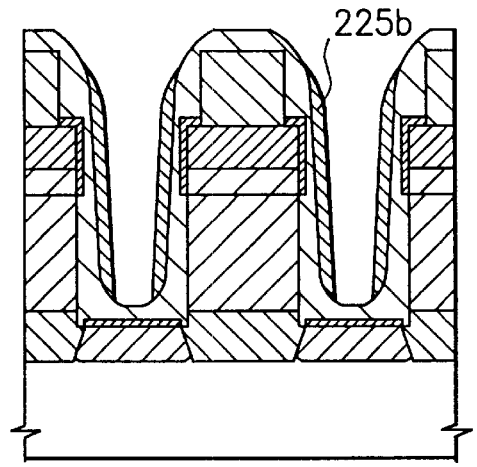
FIG. 29B is a section view showing a manufacturing process of a related part of a node contact hole of DRAM of the second example of the second embodiment of the present invention, corresponding to FIG. 27B.
Figure 29C:
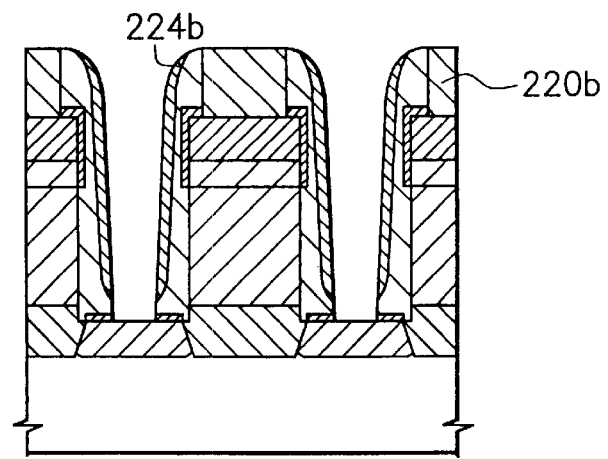
FIG. 29C is a section view showing a manufacturing process of a related part of a node contact hole of DRAM of the second example of the second embodiment of the present invention, corresponding to FIG. 27B.

The polycrystal silicon film 245b is fully etch backed by the anisotropic etching and a polycrystal silicon film spacer 225b covering the surface of the BPSG film 244ba in the node contact hole 221 is formed. By the full etch back at the time of forming the polycrystal silicon film spacer 225a, the upper end of the polycrystal silicon film spacer 225b is at about 300 nm to 350 nm lower place than the upper surface of the insulation film between layers 220 and the maximum thickness of the polycrystal silicon film spacer 225b is about 35 nm to 40 nm (FIGS. 28B and 29B).

Then, the etch back for a silicon oxide film using the polycrystal silicon film spacer 225b as a mask is implemented, this etch back is the same at the first example of the first embodiment of the present invention, a BPSG film spacer 224b is formed, moreover, the silicon oxide film 223 covering the surface of the N type source drain area 206 is opened in self matching (FIGS. 27A, 27B, 28C and 29C). After this, a storage node electrode 227 is formed and a capacity insulation film and a cell plate electrode are formed.

The second example of the second embodiment of the present invention has the same effect of the first example of the second embodiment of the present invention. At the second example of the second embodiment of the present invention, on the exposed surface by the self align contact hole at the middle and lower wiring layers, a thin silicon oxide film is selectively formed, instead of using a silicon oxide film spacer, therefore, the open area not covered with the polycrystal silicon film spacer at the lower wiring layer is larger than that of the first example of the second embodiment of the present invention. Compared with the first example of the second embodiment of the present invention, at the second example of the second embodiment of the present invention, a contact resistance between the upper wiring layer and the lower wiring layer at the self align contact hole is easy to reduce.

At the second example of the second embodiment of the present invention, the COB structure DRAM having the bit contact hole and the node contact hole made of the self align contact hole is used for explanation as an example, however the second example of the second embodiment of the present invention is applicable for the self align contact hole of the general multilayer wiring structure. At the second example of the second embodiment of the present invention, the BPSG film spacer is explained as an example, however it is not limited to this and the PSG film spacer is adoptable instead of using the BPSG film spacer. Moreover, the second example of the second embodiment of the present invention is not limited to the numerical values stated above.

As explained above in the present invention, at a semiconductor device in which the connection between an upper wiring layer and a lower wiring layer is implemented by a self align contact hole in self matching for a middle wiring layer, a silicon nitride film is not included in the insulation film covering the upper surface or the side of the middle wiring layer, an insulation film spacer made of a BPSG film or a PSG film reflowed by heat is at least included in the insulation film spacer covering the side of the self align contact hole.

Therefore, the present invention does not need to have a complicated manufacturing process at the forming of the middle wiring layer and an electric charge is not stored in the insulation film spacer provided at the side of the self align contact hole and a deterioration of insulation characteristics between the upper wiring layer via the self align contact hole, the lower wiring layer connecting to the upper wiring layer and the middle wiring layer is possible to be restrained.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device, comprising:

a substrate, including first and second diffusion regions at first and second cross-sections, respectively;

an insulation layer covering said first and second diffusion regions;

a first conductor at said first cross-section formed on said insulation layer over said first diffusion region and connected to said first diffusion region through a first contact hole formed in said insulation layer;

a second conductor at said second cross-section formed on said insulation layer over said second diffusion region and connected to said second diffusion region through a second contact hole formed in said insulation layer; and first and second film spacers of at least one of BPSG and PSG formed respectively in said first and second contact holes at said first and second cross-sections, respectively, wherein a concentration of impurity dopant of one of said first and second film spacers is lower than that of the other and wherein said first and second cross-sections are different from each other.

2. A semiconductor device in accordance with claim 1, wherein an aspect ratio of said first contact hole is smaller than that of said second contact hole, and said concentration of impurity dopant of said first film spacer is less than that of said second film spacer.

3. The semiconductor device in accordance with claim 1, wherein said concentrations of impurity dopants of said first and second film spacers are proportional to said aspect ratios of said first and second contact holes.

4. The semiconductor device in accordance with claim 1, wherein said first conductor is a bit line and said second conductor is a storage node, said aspect ratio of said first contact hole is less than that of said second contact hole, and said concentration of impurity dopant of said first film spacer is less than that of said second film spacer.

5. The semiconductor device in accordance with claim 4, wherein said concentration of impurity dopant of said first film spacer is higher than a concentration of impurity dopant of said insulation layer.

* * * * *